(12) United States Patent
Malik et al.

(10) Patent No.: US 11,749,555 B2
(45) Date of Patent: Sep. 5, 2023

(54) SEMICONDUCTOR PROCESSING SYSTEM

(71) Applicant: Applied Materials, Inc., Santa Clara, CA (US)

(72) Inventors: Sultan Malik, Sacramento, CA (US); Srinivas D. Nemani, Sunnyvale, CA (US); Qiwei Liang, Fremont, CA (US); Adib M. Khan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/706,115

(22) Filed: Dec. 6, 2019

(65) Prior Publication Data

US 2020/0185260 A1 Jun. 11, 2020

Related U.S. Application Data

(60) Provisional application No. 62/776,893, filed on Dec. 7, 2018.

(51) Int. Cl.
*H01L 21/687* (2006.01)
*H01L 21/673* (2006.01)

(52) U.S. Cl.
CPC .. *H01L 21/68742* (2013.01); *H01L 21/67376* (2013.01); *H01L 21/67393* (2013.01)

(58) Field of Classification Search
CPC ......... H01L 21/68742; H01L 21/67376; H01L 21/67393
USPC .................................................. 118/729, 733
See application file for complete search history.

(56) References Cited

U.S. PATENT DOCUMENTS

| 3,684,592 | A | 8/1972 | Chang et al. |
| 3,749,383 | A | 7/1973 | Voigt et al. |
| 3,758,316 | A | 9/1973 | Sowards et al. |
| 4,409,260 | A | 10/1983 | Pastor et al. |
| 4,424,101 | A | 1/1984 | Nowicki |
| 4,524,587 | A | 6/1985 | Kantor |
| 4,576,652 | A | 3/1986 | Hovel et al. |

(Continued)

FOREIGN PATENT DOCUMENTS

| CN | 1280875 C | 10/2006 |
| CN | 101871043 A | 10/2010 |

(Continued)

OTHER PUBLICATIONS

PCT Notification of Transmittal of the International Search Report and the Written Opinion of the International Searching Authority for International Application No. PCT/US2019/061995; dated Mar. 9, 2020; 13 total pages.

(Continued)

*Primary Examiner* — Charlee J. C. Bennett
(74) *Attorney, Agent, or Firm* — Patterson + Sheridan, LLP

(57) ABSTRACT

Embodiments of the disclosure relate to an apparatus and method for processing semiconductor substrates. In one embodiment, a processing system is disclosed. The processing system includes an outer chamber that surrounds an inner chamber. The inner chamber includes a substrate support upon which a substrate is positioned during processing. The inner chamber is configured to have an internal volume that, when isolated from an internal volume of the outer chamber, is changeable such that the pressure within the internal volume of the inner chamber may be varied.

15 Claims, 7 Drawing Sheets

(56) References Cited

U.S. PATENT DOCUMENTS

| | | | |
|---|---|---|---|
| 4,589,193 A | 5/1986 | Goth et al. | |
| 4,879,259 A | 11/1989 | Reynolds et al. | |
| 5,050,540 A | 9/1991 | Lindberg | |
| 5,114,513 A | 5/1992 | Hosokawa et al. | |
| 5,126,117 A | 6/1992 | Schumacher et al. | |
| 5,149,378 A | 9/1992 | Ohmi et al. | |
| 5,167,717 A | 12/1992 | Boitnott | |
| 5,175,123 A | 12/1992 | Vasquez et al. | |
| 5,300,320 A | 4/1994 | Barron et al. | |
| 5,314,541 A | 5/1994 | Saito et al. | |
| 5,314,574 A * | 5/1994 | Takahashi | H01L 21/67751 438/743 |
| 5,319,212 A | 6/1994 | Tokoro | |
| 5,366,905 A | 11/1994 | Mukai | |
| 5,472,812 A | 12/1995 | Sekine | |
| 5,578,132 A | 11/1996 | Yamaga et al. | |
| 5,590,695 A | 1/1997 | Siegele et al. | |
| 5,597,439 A | 1/1997 | Salzman | |
| 5,620,524 A | 4/1997 | Fan et al. | |
| 5,677,230 A | 10/1997 | Weitzel et al. | |
| 5,747,383 A | 5/1998 | Chen et al. | |
| 5,808,245 A | 9/1998 | Wiese et al. | |
| 5,857,368 A | 1/1999 | Grunes et al. | |
| 5,858,051 A | 1/1999 | Komiyama et al. | |
| 5,877,087 A | 3/1999 | Mosely et al. | |
| 5,879,756 A | 3/1999 | Fathi et al. | |
| 5,880,041 A | 3/1999 | Ong | |
| 5,886,864 A | 3/1999 | Dvorsky | |
| 5,888,888 A | 3/1999 | Talwar et al. | |
| 5,918,149 A | 6/1999 | Besser et al. | |
| 5,940,985 A | 8/1999 | Kamikawa et al. | |
| 6,071,810 A | 6/2000 | Wada et al. | |
| 6,077,571 A | 6/2000 | Kaloyeros | |
| 6,082,950 A | 7/2000 | Altwood et al. | |
| 6,086,730 A | 7/2000 | Liu | |
| 6,103,585 A | 8/2000 | Michaelis | |
| 6,136,664 A | 10/2000 | Economikos et al. | |
| 6,140,235 A | 10/2000 | Yao et al. | |
| 6,150,286 A | 11/2000 | Sun et al. | |
| 6,164,412 A | 12/2000 | Allman | |
| 6,183,564 B1 * | 2/2001 | Reynolds | H01L 21/6719 156/345.31 |
| 6,207,487 B1 | 3/2001 | Kim et al. | |
| 6,242,368 B1 | 6/2001 | Holmer et al. | |
| 6,242,808 B1 | 6/2001 | Shimizu et al. | |
| 6,251,242 B1 | 6/2001 | Fu et al. | |
| 6,251,751 B1 | 6/2001 | Chu et al. | |
| 6,277,249 B1 | 8/2001 | Gopalraja et al. | |
| 6,284,646 B1 | 9/2001 | Leem | |
| 6,299,753 B1 | 10/2001 | Chao et al. | |
| 6,305,314 B1 | 10/2001 | Sneh et al. | |
| 6,319,766 B1 | 11/2001 | Bakli et al. | |
| 6,319,847 B1 | 11/2001 | Ishikawa | |
| 6,334,249 B2 | 1/2002 | Hsu | |
| 6,334,266 B1 | 1/2002 | Moritz et al. | |
| 6,335,240 B1 | 1/2002 | Kim et al. | |
| 6,344,249 B1 | 2/2002 | Maruyama et al. | |
| 6,344,419 B1 | 2/2002 | Forster et al. | |
| 6,348,376 B2 | 2/2002 | Lim et al. | |
| 6,355,558 B1 | 3/2002 | Dixit | |
| 6,358,829 B2 | 3/2002 | Yoon et al. | |
| 6,368,412 B1 | 4/2002 | Gomi | |
| 6,372,598 B2 | 4/2002 | Kang et al. | |
| 6,387,764 B1 | 5/2002 | Curtis et al. | |
| 6,395,094 B1 * | 5/2002 | Tanaka | H01L 21/67184 414/217 |
| 6,399,486 B1 | 6/2002 | Chen et al. | |
| 6,399,491 B2 | 6/2002 | Jeon et al. | |
| 6,409,837 B1 * | 6/2002 | Hillman | C23C 16/4486 118/712 |
| 6,416,822 B1 | 7/2002 | Chiang et al. | |
| 6,428,859 B1 | 8/2002 | Chiang et al. | |
| 6,442,980 B2 | 9/2002 | Preston et al. | |
| 6,451,119 B2 | 9/2002 | Sneh et al. | |
| 6,451,695 B2 | 9/2002 | Sneh | |
| 6,458,701 B1 | 10/2002 | Chae et al. | |
| 6,464,779 B1 | 10/2002 | Powell et al. | |
| 6,468,490 B1 | 10/2002 | Shamouilian et al. | |
| 6,468,924 B2 | 10/2002 | Lee et al. | |
| 6,475,910 B1 | 11/2002 | Sneh | |
| 6,478,872 B1 | 11/2002 | Chae et al. | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,489,214 B2 | 12/2002 | Kim et al. | |
| 6,500,603 B1 | 12/2002 | Shioda | |
| 6,511,539 B1 | 1/2003 | Raaijmakers | |
| 6,534,395 B2 | 3/2003 | Werkhoven et al. | |
| 6,548,424 B2 | 4/2003 | Putkonen | |
| 6,551,929 B1 | 4/2003 | Kori et al. | |
| 6,569,501 B2 | 5/2003 | Chiang et al. | |
| 6,583,497 B2 | 6/2003 | Xia et al. | |
| 6,585,823 B1 | 7/2003 | Van Wijck | |
| 6,599,572 B2 | 7/2003 | Saanila et al. | |
| 6,599,819 B1 | 7/2003 | Goto | |
| 6,607,976 B2 | 8/2003 | Chen et al. | |
| 6,619,304 B2 | 9/2003 | Worm | |
| 6,620,670 B2 | 9/2003 | Song et al. | |
| 6,620,723 B1 | 9/2003 | Byun et al. | |
| 6,620,956 B2 | 9/2003 | Chen et al. | |
| 6,630,201 B2 | 10/2003 | Chiang et al. | |
| 6,632,279 B1 | 10/2003 | Ritala et al. | |
| 6,657,304 B1 | 12/2003 | Woo et al. | |
| 6,660,660 B2 | 12/2003 | Haukka et al. | |
| 6,686,271 B2 | 2/2004 | Raaijmakers et al. | |
| 6,780,777 B2 | 8/2004 | Yun et al. | |
| 6,797,336 B2 | 9/2004 | Garvey et al. | |
| 6,825,115 B1 | 11/2004 | Xiang et al. | |
| 6,841,432 B1 | 1/2005 | Takemura et al. | |
| 6,846,380 B2 * | 1/2005 | Dickinson | B08B 3/04 156/345.31 |
| 6,849,122 B1 | 2/2005 | Fair | |
| 6,867,130 B1 | 3/2005 | Karlsson et al. | |
| 6,867,152 B1 | 3/2005 | Hausmann et al. | |
| 6,889,627 B1 | 5/2005 | Hao | |
| 6,897,118 B1 | 5/2005 | Poon et al. | |
| 6,969,448 B1 | 11/2005 | Lau | |
| 7,055,333 B2 | 6/2006 | Leitch et al. | |
| 7,084,079 B2 | 8/2006 | Conti et al. | |
| 7,105,061 B1 | 9/2006 | Shrinivasan et al. | |
| 7,111,630 B2 | 9/2006 | Mizobata et al. | |
| 7,114,517 B2 | 10/2006 | Sund et al. | |
| 7,211,525 B1 | 5/2007 | Shanker et al. | |
| 7,282,458 B2 | 10/2007 | Gates et al. | |
| 7,361,231 B2 | 4/2008 | Fury et al. | |
| 7,422,636 B2 * | 9/2008 | Ishizaka | C23C 16/4401 118/729 |
| 7,429,402 B2 | 9/2008 | Gandikota et al. | |
| 7,432,200 B2 | 10/2008 | Chowdhury et al. | |
| 7,460,760 B2 | 12/2008 | Cho et al. | |
| 7,465,650 B2 | 12/2008 | Derderian | |
| 7,491,658 B2 | 2/2009 | Nguyen et al. | |
| 7,503,334 B1 | 3/2009 | Shrinivasan et al. | |
| 7,521,089 B2 | 4/2009 | Hillman et al. | |
| 7,521,378 B2 | 4/2009 | Fucsko et al. | |
| 7,541,297 B2 | 6/2009 | Mallick et al. | |
| 7,576,441 B2 | 8/2009 | Yin et al. | |
| 7,629,227 B1 | 12/2009 | Wang et al. | |
| 7,650,965 B2 | 1/2010 | Thayer et al. | |
| 7,651,959 B2 | 1/2010 | Fukazawa et al. | |
| 7,655,532 B1 | 2/2010 | Chen et al. | |
| 7,691,442 B2 | 4/2010 | Gandikota et al. | |
| 7,709,320 B2 | 5/2010 | Cheng | |
| 7,759,749 B2 | 7/2010 | Tanikawa | |
| 7,825,038 B2 | 11/2010 | Ingle et al. | |
| 7,825,042 B2 | 11/2010 | Mandal | |
| 7,867,914 B2 | 1/2011 | Xi et al. | |
| 7,867,923 B2 | 1/2011 | Mallick et al. | |
| 7,891,228 B2 | 2/2011 | Ding et al. | |
| 7,910,165 B2 | 3/2011 | Ganguli et al. | |
| 7,964,505 B2 | 6/2011 | Khandelwal et al. | |
| 7,964,506 B1 | 6/2011 | Ponnuswamy et al. | |
| 8,027,089 B2 | 9/2011 | Hayashi | |
| 8,278,224 B1 | 10/2012 | Mui et al. | |

(56) References Cited

U.S. PATENT DOCUMENTS

| | | |
|---|---|---|
| 8,306,026 B2 | 11/2012 | Anjum et al. |
| 8,318,584 B2 | 11/2012 | Li et al. |
| 8,349,085 B2 * | 1/2013 | Tahara ................ C23C 16/4401 |
| | | 156/345.31 |
| 8,449,942 B2 | 5/2013 | Liang et al. |
| 8,455,368 B2 | 6/2013 | Chandler et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,585,873 B2 | 11/2013 | Ford et al. |
| 8,647,992 B2 | 2/2014 | Liang et al. |
| 8,648,253 B1 | 2/2014 | Woods et al. |
| 8,668,868 B2 | 3/2014 | Chiu et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,190,321 B2 | 11/2015 | Cabral, Jr. et al. |
| 9,257,314 B1 | 2/2016 | Rivera et al. |
| 9,306,026 B2 | 4/2016 | Toriumi et al. |
| 9,330,939 B2 | 5/2016 | Zope et al. |
| 9,362,107 B2 | 6/2016 | Thadani et al. |
| 9,382,621 B2 | 7/2016 | Choi et al. |
| 9,423,313 B2 | 8/2016 | Douba et al. |
| 9,484,406 B1 | 11/2016 | Sun et al. |
| 9,502,307 B1 | 11/2016 | Bao et al. |
| 9,570,551 B1 | 2/2017 | Balakrishnan et al. |
| 9,583,655 B2 | 2/2017 | Cheng |
| 9,646,850 B2 | 5/2017 | Pethe |
| 9,679,810 B1 | 6/2017 | Nag et al. |
| 9,685,371 B2 | 6/2017 | Zope et al. |
| 9,695,503 B2 | 7/2017 | Stowell et al. |
| 9,741,626 B1 | 8/2017 | Cheng et al. |
| 9,777,378 B2 | 10/2017 | Nemani et al. |
| 10,049,927 B2 | 8/2018 | Mebarki et al. |
| 10,083,834 B2 | 9/2018 | Thompson et al. |
| 10,096,516 B1 | 10/2018 | Leschkies et al. |
| 10,179,941 B1 | 1/2019 | Khan et al. |
| 10,224,224 B2 | 3/2019 | Liang et al. |
| 10,234,630 B2 | 3/2019 | Meyer Timmerman Thijssen et al. |
| 10,269,571 B2 | 4/2019 | Wong et al. |
| 10,276,411 B2 | 4/2019 | Delmas et al. |
| 10,403,729 B2 | 9/2019 | Lee |
| 10,410,918 B2 | 9/2019 | Wu et al. |
| 10,529,585 B2 | 1/2020 | Manna et al. |
| 10,529,603 B2 | 1/2020 | Liang et al. |
| 10,566,188 B2 | 2/2020 | Clemons et al. |
| 10,622,214 B2 | 4/2020 | Wong et al. |
| 10,636,669 B2 | 4/2020 | Chen et al. |
| 10,636,677 B2 | 4/2020 | Delmas et al. |
| 10,636,704 B2 | 4/2020 | Mebarki et al. |
| 10,643,867 B2 | 5/2020 | Delmas et al. |
| 10,675,581 B2 | 6/2020 | Khan et al. |
| 10,679,827 B2 * | 6/2020 | Krishna ............ H01J 37/32724 |
| 10,685,830 B2 | 6/2020 | Delmas |
| 10,714,331 B2 | 7/2020 | Balseanu et al. |
| 10,720,341 B2 | 7/2020 | Liang et al. |
| 10,748,783 B2 | 8/2020 | Khan et al. |
| 10,790,183 B2 | 9/2020 | Sun et al. |
| 10,847,360 B2 | 11/2020 | Wong et al. |
| 10,854,483 B2 | 12/2020 | Schaller et al. |
| 10,916,433 B2 | 2/2021 | Ren et al. |
| 10,950,429 B2 | 3/2021 | Citla et al. |
| 10,957,533 B2 | 3/2021 | Jiang et al. |
| 11,018,032 B2 | 5/2021 | Delmas et al. |
| 11,101,174 B2 | 8/2021 | Jiang et al. |
| 2001/0016429 A1 | 8/2001 | Mak et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2001/0055649 A1 | 12/2001 | Ogure et al. |
| 2002/0066535 A1 | 6/2002 | Brown et al. |
| 2002/0073922 A1 | 6/2002 | Frankel et al. |
| 2002/0098715 A1 | 7/2002 | Lane et al. |
| 2002/0122885 A1 | 9/2002 | Ahn |
| 2002/0134439 A1 | 9/2002 | Kawasaki et al. |
| 2002/0148492 A1 | 10/2002 | Kamagata et al. |
| 2002/0151128 A1 | 10/2002 | Lane et al. |
| 2002/0155714 A1 | 10/2002 | Suzuki |
| 2002/0192056 A1 | 12/2002 | Reimer et al. |
| 2002/0197806 A1 | 12/2002 | Furukawa et al. |
| 2003/0022487 A1 | 1/2003 | Yoon et al. |
| 2003/0030945 A1 | 2/2003 | Heinonen et al. |
| 2003/0049372 A1 | 3/2003 | Cook et al. |
| 2003/0053893 A1 | 3/2003 | Matsunaga et al. |
| 2003/0059538 A1 | 3/2003 | Chung et al. |
| 2003/0101938 A1 | 6/2003 | Ronsse et al. |
| 2003/0121887 A1 | 7/2003 | Garvey et al. |
| 2003/0129832 A1 | 7/2003 | Fujikawa |
| 2003/0148035 A1 | 8/2003 | Lingampalli |
| 2003/0148631 A1 | 8/2003 | Kuo et al. |
| 2003/0194615 A1 | 10/2003 | Krauth |
| 2003/0207593 A1 | 11/2003 | Derderian et al. |
| 2003/0232512 A1 | 12/2003 | Dickinson et al. |
| 2004/0025908 A1 | 2/2004 | Douglas et al. |
| 2004/0060519 A1 | 4/2004 | Beauchaine et al. |
| 2004/0074869 A1 | 4/2004 | Wang et al. |
| 2004/0097060 A1 | 5/2004 | San et al. |
| 2004/0112409 A1 | 6/2004 | Schilling |
| 2004/0180510 A1 | 9/2004 | Ranade |
| 2004/0184792 A1 | 9/2004 | Hamelin et al. |
| 2004/0187792 A1 * | 9/2004 | Parks .................... G03F 7/2014 |
| | | 118/733 |
| 2004/0219800 A1 | 11/2004 | Tognetti |
| 2004/0248392 A1 | 12/2004 | Narwankar et al. |
| 2004/0255979 A1 | 12/2004 | Fury et al. |
| 2005/0003655 A1 | 1/2005 | Cathey et al. |
| 2005/0014365 A1 | 1/2005 | Moon et al. |
| 2005/0022737 A1 | 2/2005 | Shimizu et al. |
| 2005/0051194 A1 | 3/2005 | Sakashita et al. |
| 2005/0074956 A1 | 4/2005 | Autryve et al. |
| 2005/0082281 A1 | 4/2005 | Uemori et al. |
| 2005/0109392 A1 | 5/2005 | Hollars |
| 2005/0136684 A1 | 6/2005 | Mukai et al. |
| 2005/0161158 A1 | 7/2005 | Schumacher |
| 2005/0164445 A1 | 7/2005 | Lin et al. |
| 2005/0186765 A1 | 8/2005 | Ma et al. |
| 2005/0191828 A1 | 9/2005 | Al-Bayati et al. |
| 2005/0198971 A1 | 9/2005 | Leitch et al. |
| 2005/0205210 A1 | 9/2005 | Devine et al. |
| 2005/0227479 A1 | 10/2005 | Feng et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0035035 A1 | 2/2006 | Sakama |
| 2006/0079086 A1 | 4/2006 | Boit et al. |
| 2006/0084266 A1 * | 4/2006 | Narushima ....... H01L 21/28556 |
| | | 257/E21.585 |
| 2006/0091493 A1 | 5/2006 | Wu |
| 2006/0105107 A1 | 5/2006 | Lindeboom et al. |
| 2006/0105515 A1 | 5/2006 | Amos et al. |
| 2006/0105557 A1 | 5/2006 | Klee et al. |
| 2006/0110934 A1 | 5/2006 | Fukuchi |
| 2006/0124613 A1 | 6/2006 | Kumar et al. |
| 2006/0128150 A1 | 6/2006 | Gandikota et al. |
| 2006/0175012 A1 | 8/2006 | Lee |
| 2006/0207633 A1 | 9/2006 | Kim et al. |
| 2006/0226117 A1 | 10/2006 | Bertram et al. |
| 2006/0240187 A1 | 10/2006 | Weidman |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0045753 A1 | 3/2007 | Pae et al. |
| 2007/0087533 A1 | 4/2007 | Nishikawa et al. |
| 2007/0095651 A1 | 5/2007 | Ye et al. |
| 2007/0111519 A1 | 5/2007 | Lubomirsky et al. |
| 2007/0116873 A1 | 5/2007 | Li et al. |
| 2007/0145416 A1 | 6/2007 | Ohta |

(56) References Cited

U.S. PATENT DOCUMENTS

| | | |
|---|---|---|
| 2007/0187386 A1 | 8/2007 | Kim et al. |
| 2007/0204797 A1 | 9/2007 | Fischer |
| 2007/0209931 A1 | 9/2007 | Miller |
| 2007/0212850 A1 | 9/2007 | Ingle et al. |
| 2007/0243317 A1 | 10/2007 | Du Bois et al. |
| 2007/0254471 A1 | 11/2007 | Kameyama et al. |
| 2007/0254477 A1 | 11/2007 | Muraoka et al. |
| 2007/0256559 A1 | 11/2007 | Chen et al. |
| 2008/0001196 A1 | 1/2008 | Cheng |
| 2008/0073691 A1 | 3/2008 | Konno et al. |
| 2008/0074658 A1 | 3/2008 | Davis et al. |
| 2008/0076230 A1 | 3/2008 | Cheng |
| 2008/0083109 A1 | 4/2008 | Shibata et al. |
| 2008/0085611 A1 | 4/2008 | Khandelwal et al. |
| 2008/0115726 A1 | 5/2008 | Ingle et al. |
| 2008/0121882 A1 | 5/2008 | Hwang et al. |
| 2008/0132050 A1 | 6/2008 | Lavoie |
| 2008/0210273 A1 | 9/2008 | Joe |
| 2008/0241384 A1 | 10/2008 | Jeong et al. |
| 2008/0251904 A1 | 10/2008 | Theuss et al. |
| 2008/0268635 A1 | 10/2008 | Yu et al. |
| 2008/0311711 A1 | 12/2008 | Hampp et al. |
| 2008/0315762 A1 | 12/2008 | Hamada et al. |
| 2009/0018688 A1 | 1/2009 | Chandler et al. |
| 2009/0029126 A1 | 1/2009 | Tanikawa |
| 2009/0035915 A1 | 2/2009 | Su |
| 2009/0035952 A1 | 2/2009 | Chua et al. |
| 2009/0053426 A1 | 2/2009 | Lu et al. |
| 2009/0053893 A1 | 2/2009 | Khandelwal et al. |
| 2009/0081884 A1 | 3/2009 | Yokota et al. |
| 2009/0087981 A1 | 4/2009 | Suzuki et al. |
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0183992 A1 | 7/2009 | Fredenberg et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2009/0246952 A1 | 10/2009 | Ishizaka et al. |
| 2009/0269507 A1 | 10/2009 | Yu et al. |
| 2009/0283735 A1 | 11/2009 | Li et al. |
| 2009/0298257 A1 | 12/2009 | Lee et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0032838 A1 | 2/2010 | Kikuchi et al. |
| 2010/0072569 A1 | 3/2010 | Han et al. |
| 2010/0102417 A1 | 4/2010 | Ganguli et al. |
| 2010/0173470 A1 | 7/2010 | Lee et al. |
| 2010/0173495 A1 | 7/2010 | Thakur et al. |
| 2010/0196626 A1 | 8/2010 | Choi et al. |
| 2010/0203725 A1 | 8/2010 | Choi et al. |
| 2010/0248419 A1 | 9/2010 | Woodruff et al. |
| 2010/0273324 A1 | 10/2010 | Lin et al. |
| 2010/0297854 A1 | 11/2010 | Ramamurthy et al. |
| 2010/0304027 A1 | 12/2010 | Lee et al. |
| 2010/0320459 A1 | 12/2010 | Umeda et al. |
| 2010/0323517 A1 | 12/2010 | Baker-O'Neal et al. |
| 2010/0327422 A1 | 12/2010 | Lee et al. |
| 2011/0011737 A1 | 1/2011 | Wu et al. |
| 2011/0048524 A1 | 3/2011 | Nam et al. |
| 2011/0124192 A1 | 5/2011 | Ganguli et al. |
| 2011/0151677 A1 | 6/2011 | Wang et al. |
| 2011/0163449 A1 | 7/2011 | Kelly et al. |
| 2011/0165781 A1 | 7/2011 | Liang et al. |
| 2011/0174363 A1 | 7/2011 | Munteanu |
| 2011/0198736 A1 | 8/2011 | Shero et al. |
| 2011/0204518 A1 | 8/2011 | Arunachalam |
| 2011/0233778 A1 | 9/2011 | Lee et al. |
| 2011/0237019 A1 | 9/2011 | Horng et al. |
| 2011/0240464 A1 | 10/2011 | Rasheed et al. |
| 2011/0263091 A1 | 10/2011 | Yamazaki |
| 2011/0303147 A1 | 12/2011 | Tachibana et al. |
| 2011/0305836 A1 | 12/2011 | Murata et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0100678 A1 | 4/2012 | Sako et al. |
| 2012/0112224 A1 | 5/2012 | Le Bellac et al. |
| 2012/0138146 A1 | 6/2012 | Furuhata et al. |
| 2012/0142192 A1 | 6/2012 | Li et al. |
| 2012/0142198 A1 | 6/2012 | Wang et al. |
| 2012/0153483 A1 | 6/2012 | Akolkar et al. |
| 2012/0175822 A1 | 7/2012 | Inamiya et al. |
| 2012/0252207 A1 | 10/2012 | Lei et al. |
| 2012/0252210 A1 | 10/2012 | Tohnoe |
| 2012/0258602 A1 | 10/2012 | Subramani et al. |
| 2012/0285492 A1 | 11/2012 | Lee et al. |
| 2012/0304485 A1 | 12/2012 | Hayashi et al. |
| 2012/0309190 A1 | 12/2012 | Kelly et al. |
| 2013/0068391 A1 | 3/2013 | Mazzocco et al. |
| 2013/0069174 A1 | 3/2013 | Chuang et al. |
| 2013/0194350 A1 | 8/2013 | Watanabe et al. |
| 2013/0233170 A1 | 9/2013 | Spiegelman et al. |
| 2013/0241037 A1 | 9/2013 | Jeong et al. |
| 2013/0256125 A1 | 10/2013 | Young et al. |
| 2013/0277760 A1 | 10/2013 | Lu et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0003892 A1 | 1/2014 | Yamamoto et al. |
| 2014/0023320 A1 | 1/2014 | Lee et al. |
| 2014/0034632 A1 | 2/2014 | Pan et al. |
| 2014/0045300 A1 | 2/2014 | Chen et al. |
| 2014/0051264 A1 | 2/2014 | Mallick et al. |
| 2014/0076494 A1 | 3/2014 | Miyashita et al. |
| 2014/0102877 A1 | 4/2014 | Yamazaki |
| 2014/0134827 A1 | 5/2014 | Swaminathan et al. |
| 2014/0138802 A1 | 5/2014 | Starostine et al. |
| 2014/0144462 A1 | 5/2014 | Verhaverbeke et al. |
| 2014/0159135 A1 | 6/2014 | Fujimoto et al. |
| 2014/0183743 A1 | 7/2014 | Matsumoto et al. |
| 2014/0213070 A1 | 7/2014 | Hong et al. |
| 2014/0231384 A1 | 8/2014 | Underwood et al. |
| 2014/0234583 A1 | 8/2014 | Ryu et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0273335 A1 | 9/2014 | Abushama |
| 2014/0284821 A1 | 9/2014 | Hubbard |
| 2014/0319129 A1 | 10/2014 | Ahmad |
| 2014/0319462 A1 | 10/2014 | Huang et al. |
| 2014/0322921 A1 | 10/2014 | Ahmad et al. |
| 2015/0000870 A1 | 1/2015 | Hosotani et al. |
| 2015/0021672 A1 | 1/2015 | Chuang et al. |
| 2015/0024592 A1 | 1/2015 | Chandrashekar et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0093891 A1 | 4/2015 | Zope et al. |
| 2015/0099342 A1 | 4/2015 | Tsai et al. |
| 2015/0144999 A1 | 5/2015 | Ching et al. |
| 2015/0145002 A1 | 5/2015 | Lee et al. |
| 2015/0159272 A1 | 6/2015 | Yoon et al. |
| 2015/0179501 A1 | 6/2015 | Jhaveri et al. |
| 2015/0197455 A1 | 7/2015 | Pranov |
| 2015/0203961 A1 | 7/2015 | Ha et al. |
| 2015/0255581 A1 | 9/2015 | Lin et al. |
| 2015/0279635 A1 | 10/2015 | Subramani et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0348824 A1 | 12/2015 | Kuenle et al. |
| 2015/0357195 A1 | 12/2015 | Lam et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0053366 A1 | 2/2016 | Stowell et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |

(56) References Cited

U.S. PATENT DOCUMENTS

| | | |
|---|---|---|
| 2016/0093726 A1 | 3/2016 | Ching et al. |
| 2016/0111272 A1 | 4/2016 | Girard et al. |
| 2016/0111337 A1 | 4/2016 | Hatcher et al. |
| 2016/0118260 A1 | 4/2016 | Mebarki et al. |
| 2016/0118391 A1 | 4/2016 | Zhao et al. |
| 2016/0126104 A1 | 5/2016 | Shaviv et al. |
| 2016/0163540 A1 | 6/2016 | Liao et al. |
| 2016/0181414 A1 | 6/2016 | Huang et al. |
| 2016/0186363 A1 | 6/2016 | Merzaghi et al. |
| 2016/0189951 A1 | 6/2016 | Lee et al. |
| 2016/0204027 A1 | 7/2016 | Lakshmanan et al. |
| 2016/0208414 A1 | 7/2016 | Odawara et al. |
| 2016/0260526 A1 | 9/2016 | Otto |
| 2016/0268127 A1 | 9/2016 | Yamazaki |
| 2016/0273758 A1 | 9/2016 | Fujimura |
| 2016/0274454 A1 | 9/2016 | Beasley et al. |
| 2016/0284882 A1 | 9/2016 | Jang |
| 2016/0308048 A1 | 10/2016 | Ching et al. |
| 2016/0314964 A1 | 10/2016 | Tang et al. |
| 2016/0329190 A1 | 11/2016 | Evans et al. |
| 2016/0329458 A1 | 11/2016 | Evans et al. |
| 2016/0334162 A1 | 11/2016 | Kim et al. |
| 2016/0336405 A1 | 11/2016 | Sun et al. |
| 2016/0336475 A1 | 11/2016 | Mackie et al. |
| 2016/0353522 A1 | 12/2016 | Rathi et al. |
| 2016/0355927 A1 | 12/2016 | Weaver et al. |
| 2016/0358809 A1 | 12/2016 | Brown et al. |
| 2016/0358815 A1 | 12/2016 | Yu et al. |
| 2016/0372319 A1 | 12/2016 | Zeng et al. |
| 2016/0377972 A1 | 12/2016 | Hofmann et al. |
| 2016/0379853 A1 | 12/2016 | Schaller et al. |
| 2016/0379854 A1 | 12/2016 | Vopat et al. |
| 2017/0005188 A1 | 1/2017 | Cheng et al. |
| 2017/0005204 A1 | 1/2017 | Hosoba et al. |
| 2017/0011932 A1 | 1/2017 | Pethe et al. |
| 2017/0053784 A1 | 2/2017 | Subramani et al. |
| 2017/0053946 A1 | 2/2017 | Matsuzaki et al. |
| 2017/0084487 A1 | 3/2017 | Chebiam et al. |
| 2017/0104062 A1 | 4/2017 | Bi et al. |
| 2017/0110616 A1 | 4/2017 | Dissanayake et al. |
| 2017/0117379 A1 | 4/2017 | Chen et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0200642 A1 | 7/2017 | Shaviv |
| 2017/0253968 A1 | 9/2017 | Yahata |
| 2017/0263702 A1 | 9/2017 | Chan et al. |
| 2017/0263773 A1 | 9/2017 | Yamazaki |
| 2017/0287842 A1 | 10/2017 | Fu et al. |
| 2017/0301767 A1 | 10/2017 | Niimi et al. |
| 2017/0314125 A1 | 11/2017 | Fenwick et al. |
| 2017/0317109 A1 | 11/2017 | Wang et al. |
| 2017/0358483 A1 | 12/2017 | Roy et al. |
| 2018/0003567 A1 | 1/2018 | Petry et al. |
| 2018/0019249 A1 | 1/2018 | Zhang et al. |
| 2018/0023192 A1 | 1/2018 | Chandra et al. |
| 2018/0033615 A1 | 2/2018 | Tjandra |
| 2018/0051368 A1 | 2/2018 | Liu et al. |
| 2018/0053725 A1 | 2/2018 | Edelstein et al. |
| 2018/0068890 A1 | 3/2018 | Zope et al. |
| 2018/0087418 A1 | 3/2018 | Cadigan et al. |
| 2018/0096847 A1 | 4/2018 | Thompson et al. |
| 2018/0096874 A1 | 4/2018 | Schaller et al. |
| 2018/0182856 A1 | 6/2018 | Lee |
| 2018/0209037 A1 | 7/2018 | Citla et al. |
| 2018/0240682 A1 | 8/2018 | Lai et al. |
| 2018/0258533 A1 | 9/2018 | Liang et al. |
| 2018/0261480 A1 | 9/2018 | Liang et al. |
| 2018/0286674 A1 | 10/2018 | Manna et al. |
| 2018/0308669 A1 | 10/2018 | Bokka et al. |
| 2018/0315626 A1 | 11/2018 | Franklin |
| 2018/0323093 A1 | 11/2018 | Zhang et al. |
| 2018/0337027 A1 | 11/2018 | L'Heureux et al. |
| 2018/0342384 A1* | 11/2018 | Wong .................. H01L 21/0217 |
| 2018/0342396 A1 | 11/2018 | Wong et al. |
| 2018/0350563 A1 | 12/2018 | Manna et al. |
| 2018/0366328 A1 | 12/2018 | Ren et al. |
| 2019/0019708 A1 | 1/2019 | Weaver et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0170591 A1 | 6/2019 | Petry et al. |
| 2019/0198367 A1 | 6/2019 | Liang et al. |
| 2019/0198368 A1 | 6/2019 | Weaver et al. |
| 2019/0228982 A1 | 7/2019 | Chen et al. |
| 2019/0229004 A1 | 7/2019 | Schaller et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0259638 A1 | 8/2019 | Schaller et al. |
| 2019/0279879 A1 | 9/2019 | Singh et al. |
| 2019/0311896 A1 | 10/2019 | Balseanu et al. |
| 2019/0326138 A1 | 10/2019 | Forderhase et al. |
| 2019/0360100 A1 | 11/2019 | Nguyen et al. |
| 2019/0360633 A1 | 11/2019 | Schaller et al. |
| 2019/0368035 A1 | 12/2019 | Malik et al. |
| 2019/0371650 A1 | 12/2019 | Sun et al. |
| 2019/0375105 A1 | 12/2019 | Weaver et al. |
| 2020/0035509 A1 | 1/2020 | Khan et al. |
| 2020/0035513 A1 | 1/2020 | Khan et al. |
| 2020/0075392 A1 | 3/2020 | Brown et al. |
| 2020/0098574 A1 | 3/2020 | Wong et al. |
| 2021/0167235 A1 | 6/2021 | Li et al. |

FOREIGN PATENT DOCUMENTS

| | | |
|---|---|---|
| CN | 104047676 A | 9/2014 |
| CN | 104089491 A | 10/2014 |
| CN | 103035513 B | 10/2016 |
| EP | 0516344 A1 | 12/1992 |
| EP | 0670590 A2 | 9/1995 |
| EP | 1069213 A2 | 1/2001 |
| EP | 1107288 A2 | 6/2001 |
| EP | 0840365 A3 | 10/2003 |
| JP | S63-004616 A | 1/1988 |
| JP | S6367721 A | 3/1988 |
| JP | H1218018 A | 8/1989 |
| JP | H04355922 A | 12/1992 |
| JP | H0521347 A | 1/1993 |
| JP | H06283496 A | 10/1994 |
| JP | H07048489 B2 | 5/1995 |
| JP | H07158767 A | 6/1995 |
| JP | H08195493 A | 7/1996 |
| JP | H09048690 A | 2/1997 |
| JP | H9296267 A | 11/1997 |
| JP | H10214880 A | 8/1998 |
| JP | H10335657 A | 12/1998 |
| JP | H11209872 A | 8/1999 |
| JP | H11354515 A | 12/1999 |
| JP | 2000221799 A | 8/2000 |
| JP | 2000357699 A | 12/2000 |
| JP | 2001053066 A | 2/2001 |
| JP | 2001110729 A | 4/2001 |
| JP | 2001274161 A | 10/2001 |
| JP | 200351474 A | 2/2003 |
| JP | 2003166065 A | 6/2003 |
| JP | 2003188387 A | 7/2003 |
| JP | 2004127958 A | 4/2004 |
| JP | 200579528 A | 3/2005 |
| JP | 2005064269 A | 3/2005 |
| JP | 2005530343 A | 10/2005 |
| JP | 2005333015 A | 12/2005 |
| JP | 2006526125 A | 11/2006 |
| JP | 2007242791 A | 9/2007 |
| JP | 2008073611 A | 4/2008 |
| JP | 2008118118 A | 5/2008 |
| JP | 2008153635 A | 7/2008 |
| JP | 2009129927 A | 6/2009 |
| JP | 2009539231 A | 11/2009 |
| JP | 201080949 A | 4/2010 |

(56) References Cited

FOREIGN PATENT DOCUMENTS

| | | | |
|---|---|---|---|
| JP | 2010168607 A | 8/2010 | |
| JP | 2010205854 A | 9/2010 | |
| JP | 201129394 A | 2/2011 | |
| JP | 2011258943 A | 12/2011 | |
| JP | 2012503883 A | 2/2012 | |
| JP | 2012204656 A | 10/2012 | |
| JP | 2013105777 A | 5/2013 | |
| JP | 2013516788 A | 5/2013 | |
| JP | 2013179244 A | 9/2013 | |
| JP | 2014019912 A | 2/2014 | |
| JP | 2014103351 A | 6/2014 | |
| JP | 2015067884 A | 4/2015 | |
| JP | 2015086459 A | 5/2015 | |
| JP | 2015115394 A | 6/2015 | |
| JP | 2015233157 A | 12/2015 | |
| KR | 19980063671 A | 10/1998 | |
| KR | 20010046843 A | 6/2001 | |
| KR | 20030052162 A | 6/2003 | |
| KR | 100422433 B1 | 7/2004 | |
| KR | 10-20040068969 A | 8/2004 | |
| KR | 20050121750 A | 12/2005 | |
| KR | 100684910 B1 | 2/2007 | |
| KR | 20070075383 A | 7/2007 | |
| KR | 20090011463 A | 2/2009 | |
| KR | 1020090040867 A | 4/2009 | |
| KR | 10-2009-0064279 A | 6/2009 | |
| KR | 10-2010-0035000 A | 4/2010 | |
| KR | 20110136532 A | 12/2011 | |
| KR | 101287035 B1 | 7/2013 | |
| KR | 101305904 B1 | 9/2013 | |
| KR | 20140003776 A | 1/2014 | |
| KR | 20140104112 A | 8/2014 | |
| KR | 101438291 B1 | 9/2014 | |
| KR | 20140135744 A | 11/2014 | |
| KR | 20150006587 A | 1/2015 | |
| KR | 20150122432 A | 11/2015 | |
| KR | 20160044004 A | 4/2016 | |
| KR | 20160061437 A | 5/2016 | |
| KR | 101698021 B1 | 1/2017 | |
| TW | 200529284 A | 9/2005 | |
| TW | 200721316 A | 6/2007 | |
| TW | 201507174 A | 2/2015 | |
| TW | 201608672 A | 3/2016 | |
| TW | 201708597 A | 3/2017 | |
| WO | 200051938 A1 | 9/2000 | |
| WO | 03023827 A1 | 3/2003 | |
| WO | 2004102055 A1 | 11/2004 | |
| WO | 2005057663 A2 | 6/2005 | |
| WO | 2008047886 A1 | 4/2008 | |
| WO | 2008089178 A2 | 7/2008 | |
| WO | 2010115128 A3 | 1/2011 | |
| WO | 2011002058 A1 | 1/2011 | |
| WO | 2011103062 A2 | 8/2011 | |
| WO | 2012133583 A1 | 10/2012 | |
| WO | 2014115600 A1 | 7/2014 | |
| WO | 2015195081 A1 | 12/2015 | |
| WO | 2016018593 A1 | 2/2016 | |
| WO | 2016065219 A1 | 4/2016 | |
| WO | 2016111833 A1 | 7/2016 | |
| WO | 2018187546 A1 | 10/2018 | |

OTHER PUBLICATIONS

Korean Office Action dated Jul. 16, 2021 for Application No. 10-2020-7007956.
Office Action for Japanese Patent Application No. 2020-543976 dated Jul. 13, 2021.
Taiwan Office Action dated Jul. 28, 2021 for Application No. 107108016.
International Search Report and Written Opinion for International Application No. PCT/US2019/032609 dated Sep. 11, 2019.
Lin, Kevin L. et al.—"Nickel silicide for interconnects", 2015 IEEE International Interconnect Technology Conference and 2015 IEEE Materials for Advanced Metallization Conference (IITC/MAM), IEEE, (XP032808874), May 18, 2015, pp. 169-172.
EPO Extended European Search Report dated Aug. 9, 2019, for European Patent Application No. 19166775.7.
Japanese Office Action dated Mar. 17, 2020, for Japanese Patent Application No. 2019-073230.
Taiwan Office Action dated Mar. 31, 2020, for Taiwan Patent Application No. 108111883.
Korean Office Action dated Aug. 4, 2020, for Korean Patent Application No. 10-2019-0040236.
Japanese Office Action dated Nov. 10, 2020, for Japanese Patent Application No. 2019-073230.
T. Miyake et al., "Effects of atomic hydrogen on Cu reflow process", AIP Conferenec Proceedings 418, 419 (1998).
International Search Report and Written Opinion dated Aug. 24, 2017 for Application No. PCT/US2017/033862.
Taiwan Office Action for Application No. 106119184 dated Mar. 6, 2019.
Japanese Office Action for Application No. 2018-564195 dated Nov. 19, 2019.
International Search Report PCT/2020/046396 dated Nov. 26, 2020 consists of 12 pages.
International Search Report and Written Opinion for PCT/US2021/014991 dated May 17, 2021.
Korean Office Action dated Aug. 26, 2021, for Korean Patent Application No. 10-2020-4016526.
International Search Report and Written Opinion for PCT/US2018/021715 dated Jun. 22, 2018.
International Search Report and Written Opinion from dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al.,"The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/043160 dated Jan. 31, 2019.
International Search Report and Written Opinion dated Jan. 31, 2019 for Application No. PCT/US2018/042760.
International Search Report and Written Opinion for PCT/US2018/059643 dated Feb. 26, 2019.
International Search Report and Written Opinion from PCT/US2019/012161 dated Apr. 30, 2019.
International Search Report and Written Opinion for PCT/US2019/015339 dated May 15, 2019.
International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136151.

(56) References Cited

OTHER PUBLICATIONS

International Search Report and Written Opinion for International Application No. PCT/US2019/029602 dated Aug. 14, 2019.
Taiwan Office Action dated Jun. 11, 2019 for Application No. 107138905.
Office Action for Japanese Application No. 2018-546484 dated Oct. 8, 2019.
International Search Report and Written Opinion for International Application No. PCT/US2019/040195 dated Oct. 25, 2019.
Taiwan Office Action dated Nov. 19, 2019 for Application No. 108103415.
Office Action for Japanese Application No. 2018-517285 dated Oct. 23, 2019.
Office Action for Taiwan Patent Application No. 108111501 dated Nov. 14, 2019.
International Search Report and Written Opinion for PCT/US2018/050464 dated Jan. 4, 2019.
International Search Report and Written Opinion for PCT/US2019/056447 dated Feb. 7, 2020.
KR Office Action dated Feb. 4, 2020 for Application No. 10-2018-0133399.
Taiwan Office Action dated Feb. 21, 2020 for Application No. 108138212.
International Search Report and Written Opinion for International Application No. PCT/US2019/059659 dated Feb. 26, 2020.
Office Action from Taiwan Patent Application No. 108104585 dated Jan. 30, 2020, with concise statement of relevance.
Pedestal definition from Dictionary.com, printed on Feb. 10, 2020 (year 2020).
Taiwan Office Action dated Oct. 12, 2020 for Application No. 108140559.
Office Action for Japanese Application No. 2019-548976 dated Oct. 20, 2020.
European International Search Report issued to 18764622.9 dated Nov. 20, 2020.
Office Action for Korean Application No. 10-2019-7029776 dated Jan. 18, 2021.
Taiwan Office Action dated May 4, 2020 for Application No. 107121254.
Japanese Office Action dated Feb. 16, 2021 for Application No. 2019-564964.
Extended European International Search Report issued to 18831823.2 dated Mar. 19, 2021.
Office Action for Korean Application No. 10-2020-7004396 dated Apr. 5, 2021.
Japanese Office Action dated Apr. 20, 2021 for Application No. JP 2020-508603.
Korean Office Action issued to Application No. 10-2019-7038099 dated May 1, 2021.
Office Action for Japanese Patent Application No. 2019-548976 dated May 25, 2021.
Office Action for Japanese Patent Application No. 2020-500629 dated Jun. 8, 2021.
Extended European Search Report for EP Application No. 18876650.5 dated Jul. 19, 2021.
Extended European Search Report for EP Application No. 18806169.1 dated Jul. 19, 2021.
Taiwan Office Action for Application No. 108142682 dated Jul. 10, 2023.

\* cited by examiner

SEMICONDUCTOR PROCESSING SYSTEM

CROSS-REFERENCE TO RELATED APPLICATIONS

This application claims benefit of U.S. Provisional Application Ser. No. 62/776,893, filed Dec. 7, 2018, of which is incorporated by reference in its entirety.

BACKGROUND

Field

Embodiments of the disclosure generally relate to fabrication of integrated circuits and particularly to a system and method for processing semiconductor substrates.

Description of the Related Art

Formation of a semiconductor device, such as memory devices, logic devices, microprocessors etc. involves deposition of one or more films over a semiconductor substrate. The films are used to create the circuitry required to manufacture the semiconductor device. Annealing is a heat treatment process used to achieve various effects on the deposited films to improve their electrical properties. For example, annealing can be used to activate dopants, densify the deposited films, or change states of grown films.

Maintaining a low thermal budget (i.e., less than about 400 degrees Celsius) is desirable to improve film quality in both deposition and anneal applications. However, due to small device geometries and film thicknesses, obtaining desired processing results at such low low thermal budgets is extremely challenging.

Thus, there is a need for an improved system and method for processing semiconductor substrates that can accommodate the challenges associated with manufacturing modern semiconductor devices.

SUMMARY

Embodiments of the disclosure relate to a system and method for processing semiconductor substrates. In one embodiment, a processing system is disclosed. The processing system includes an outer chamber that surrounds an inner chamber. The inner chamber includes a substrate support upon which a substrate is positioned during processing. The inner chamber is configured to have an internal volume that, when isolated from an internal volume of the outer chamber, is changeable such that the pressure within the internal volume of the inner chamber may be varied.

In another example, a method of processing a substrate in a processing system is provided. The method includes loading a substrate into an internal volume of an inner chamber that is surrounded by an outer chamber, reducing the internal volume of the inner chamber having the substrate therein, and processing the substrate in the reduced internal volume.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure relate to an apparatus and method for processing semiconductor substrates. The substrates may be annealed, have a film deposited thereon, or processed in another manner inside an inner chamber that is disposed within an outer chamber. During processing, a substrate disposed in the inner chamber is exposed to a processing fluid under high pressure at a high temperature. The pressure within the inner chamber is controlled, at least in part, by changing the volume of the inner chamber. Advantageously, controlling the pressure of the inner chamber by changing the volume allows for less processing fluid to be utilized when processing the substrate. Additionally, processing fluid can be delivered at low pressure prior to decreasing the volume for increasing the pressure within the processing chamber for processing the substrate, such that less expensive and less complicated fluid delivery systems may be utilized, while also making the system more accommodating to a wider variety of processing fluids.

In practice, the processing fluid is flowed from a supply through a fluid circuit into the inner chamber holding the substrate to be processed. The fluid circuit may be temperature-controlled to prevent condensation of the processing fluid. For example, the processing fluid may be maintained at a temperature above the condensation point of the processing fluid by one or more heaters coupled to the fluid circuit. The fluid circuit is coupled to an exhaust system, which may include a condenser where the processing fluid is condensed into liquid phase after processing the substrate is complete.

Figure 1:
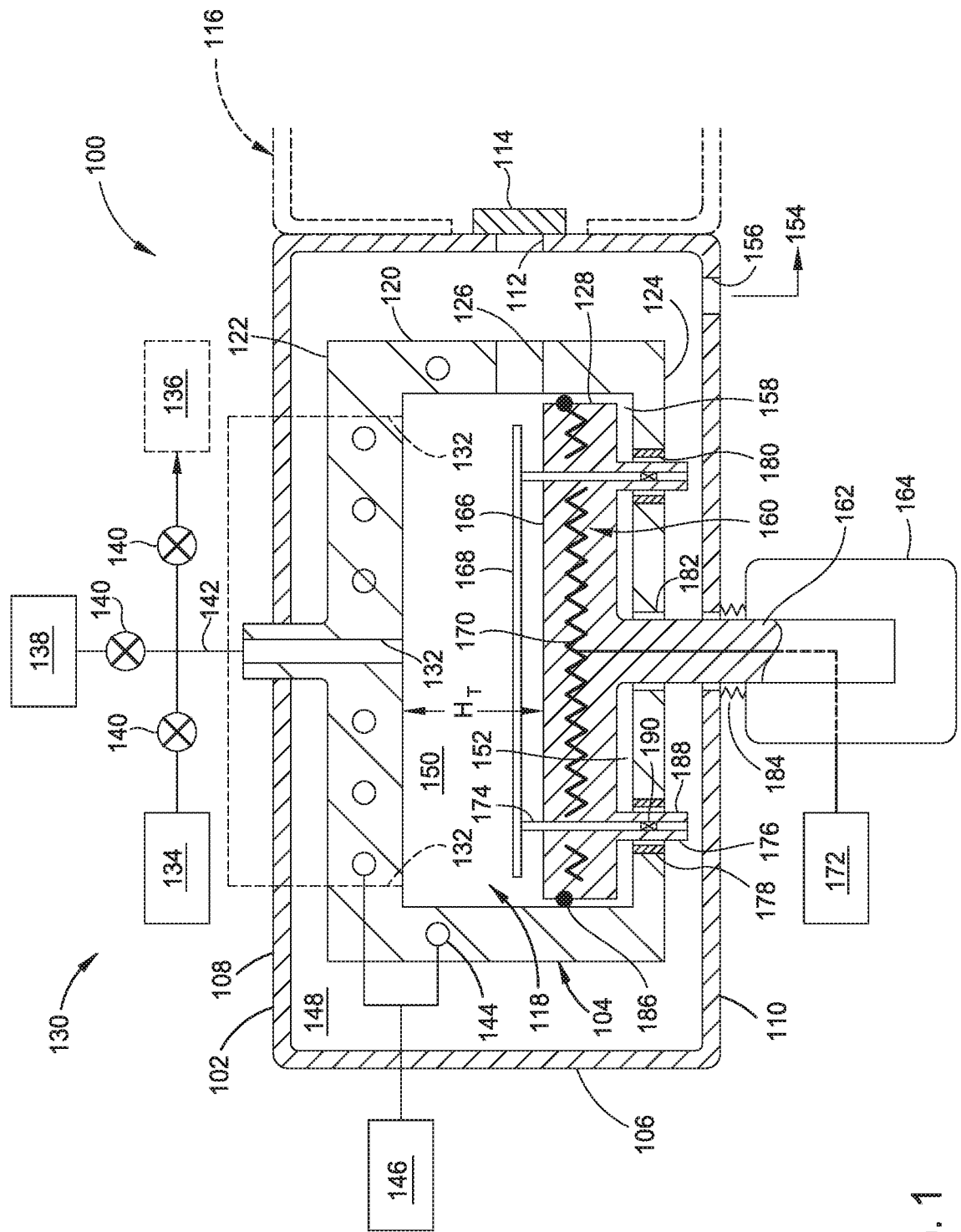
FIG. 1 is a simplified front cross-sectional view of a semiconductor processing system, the semiconductor processing system having an internal volume of an inner chamber at a first volume.

FIG. 1 is simplified front cross-sectional view of a processing system 100 for high-pressure processing of substrates. The processing system 100 has a an outer chamber 102 that surrounds an inner chamber 104. The inner chamber 104 includes a substrate support 160 on which a substrate 168 is processed. A fluid handling system 130 is coupled to the inner chamber 104 to provide processing fluid to the inner chamber 104 for processing the substrate 168.

The outer chamber 102 includes sidewalls 106, a top 108 and a bottom 110 that encloses an internal volume 148. The inner chamber 104 resides essentially within the internal volume 148 of the outer chamber 102. A slit valve opening 112 is formed through one of the sidewalls 106 of the outer chamber 102 to allow entry and egress of the substrate 168 between the system 100 and an adjacent chamber 116 of a vacuum processing system, such as a cluster tool, to which the system 100 is attached. The slit valve opening 112 is selectively sealed by a slit valve door 114.

The bottom 110 or other portion of the outer chamber 102 includes an exhaust port 156 that is coupled to a pumping system 154. The pumping system 154 is utilized to regulate the pressure (i.e., vacuum) within the internal volume 148 of the outer chamber 102. The pumping system 154 may maintain the pressure within the internal volume 148 of the outer chamber 102 between about 1 mTorr to about 600 Torr.

The inner chamber 104 may be made from a corrosion resistant steel (CRS), such as but not limited to stainless steel. Interior surfaces of the inner chamber 104 may be made from or covered with nickel-based steel alloys that exhibit high resistance to corrosion, such as but not limited to HASTELLOY®, ICONEL®, and MONEL®. Optionally, the inner chamber 104 may be fabricated from a nickel-based steel alloy.

The inner chamber 104 includes sidewalls 120, a top 122 and a bottom 124 that encloses an inner chamber volume 118. The inner chamber volume 118 is bifurcated by the substrate support 160 into an internal (processing) volume 150 defined between the substrate support 160 and the top 122 of inner chamber 104, and a secondary volume 152 defined between the substrate support 160 and the bottom 124 of inner chamber 104. A substrate access port 126 is formed through the one of the sidewalls 120 of the inner chamber 104 and aligns with the slit valve opening 112 of the outer chamber 102 to allow entry and egress of the substrate 168 between the internal volume 150 and the adjacent chamber 116 of a vacuum processing system utilizing a single motion of a robot blade. The substrate access port 126 does not require sealing and may be maintained in an open state throughout operation of the processing system 100. Advantageously, a non-sealing substrate access port 126 eliminates the need and associated costs of a slit valve door. Of course, the substrate access port 126 may alternatively be configured to be selectively sealed by a slit valve door if desired.

The top 108 and at least an upper portion of the sidewalls 120 of the inner chamber 104 include heaters 144. The heaters 144 are utilized to maintain the top 108 and the upper portion of the sidewalls 120 of the inner chamber 104 at a temperature sufficiently high enough to substantially prevent condensation of the processing fluids present with the internal volume 150 of the inner chamber 104. In one example, the heaters 144 are resistive heaters that are coupled to a heater power source 146.

At least one port 132 is disposed through the top 108 and/or sidewalls 120 of the inner chamber 104 for providing processing fluid and/or other fluids into the internal volume 150 of the inner chamber 104. The port 132 may be disposed in a center of the top 120 of the inner chamber 104, at the sides of the top 120 of the inner chamber 104 (as shown in phantom) or in another suitable location. In one example, a plurality of ports 132 are symmetrically arranged around a centerline of the inner chamber 104 that extends perpendicularly through the top 120.

A fluid handling system 130 is coupled to the at least one port 132 by a fluid circuit 142. The fluid handling system 130 includes a fluid source 134 to provide at least processing fluid into the internal volume 150 of the inner chamber 104 through the port 132. The fluid source 134 may include a vaporizer. It is contemplated that the processing fluid provided by the fluid source 134 is selected according to the process requirements for the desired process to be performed on the substrate 168 in the processing system 100. The fluid source 134 provides processing fluids which may comprise an oxygen-containing and/or nitrogen-containing gas, such as oxygen, steam, water, hydrogen peroxide, and/or ammonia. Alternatively or in addition to the oxygen-containing and/or nitrogen-containing gases, the processing fluid may comprise a silicon-containing gas such as but not limited to organosilicon, tetraalkyl orthosilicate gases and disiloxane gases. In some embodiments, the processing fluid may be steam, dry steam or superheated steam. When a single port 132 is utilized, the fluid handling system 130 may not only provide processing fluid into the internal volume 150 of the inner chamber 104, but also exhaust processing or other fluids from the internal volume 150 of the inner chamber 104 to a fluid exhaust system 136 after processing the substrate. Alternatively, the fluid source 134 of the fluid handling system 130 may be coupled to the internal volume 150 of the inner chamber 104 through multiple ports 132, for example, with one port 132 utilized to provide processing fluid into the internal volume 150 of the inner chamber 104 while a second port 132 utilized to exhaust processing or other fluids from the internal volume 150 of the inner chamber 104 to the fluid exhaust system 136. The fluid exhaust system 136 may include a condenser for condensing fluids exiting the internal volume 150 of the inner chamber 104.

The fluid handling system 130 may optionally include a remote plasma source (RPS) 138. The RPS 138 provides disassociated cleaning species, such as one or more of fluorine, hydrogen and oxygen, into the internal volume 150 of the inner chamber 104 for removing processing byproducts from the surfaces exposed to the internal volume 150.

The fluid circuit 142 of the fluid handling system 130 also includes a plurality of isolation valves 140. The isolation valves 140 are utilized to selectively connect and isolate the fluid source 134, the exhaust system 136 and the RPS 138 from the internal volume 150. One or more of the isolation valves 140 may be set to a closed state to statically seal the processing fluids within the internal volume 150. The fluid circuit 142 may additionally include heaters (not shown) to maintain a processing fluid flowing through the fluid circuit 142 at a temperature above the condensation point of the processing fluid.

The substrate support 160 resides within the inner chamber volume 118 of the inner chamber 104. The substrate support 160 may be fabricated from a material suitable for processing the substrate 168 in a high temperature/high pressure environment. In one example, the substrate support 160 is fabricated from stainless steel. The substrate support 160 includes an upper surface (i.e., a substrate support surface) 166, an outer wall 128 and a bottom surface 158. A heater 170 is disposed in the substrate support 160 and is utilized to heat the substrate 168 during processing. The heater 170 may be a resistive or other suitable heating element, such as channels for flowing a heat transfer fluid, among others. In the example depicted in FIG. 1, the heater 170 is a resistive heating element that is coupled to a power source 172.

A seal 186 is disposed between the outer wall 128 of the substrate support 160 and the sidewalls 120 of the inner chamber 104. The seal 186 is a dynamic seal that allows the substrate support 160 to move relative to the sidewalls 120 without loss of the integrity of the seal. The seal 186 may be a piston seal, metal seal, polymer seal or hybrid (metal/polymer) seal. In one example, the seal 186 may made from high-temperature polymer (i.e., 300 degrees Celsius), such as but not limited to a perfluoroelastomer. The seal 186 may be a metal piston seal with a carbon coating. The seal 186 may be spring loaded or inflatable. The seal 186 also separates the internal volume 150 from the secondary volume 152.

The substrate support 160 is coupled by a stem 162 to a lift 164. The lift 164 may be a hydraulic or pneumatic actuator, a linear actuator, a lead screw, or other actuator suitable of generating a large force sufficient to maintain the position of the substrate support 160 in a high pressure environment, as further discussed below. The lift 164 is utilized to elevate and lower the substrate support 160 within the inner chamber volume 118 of the inner chamber 104. For example, the lift 164 may move the substrate support 160 to a lower position below the substrate transfer port 126 to allow robotic transfer of the substrate 168 onto and off of the substrate support surface 166. In the lower position, the distance between the substrate support surface 166 and the top 122 of the inner chamber 104 is shown as $H_T$. The lift 164 also elevates the substrate support 160 above the substrate transfer port 126 such that the volume of the internal volume 150 is reduced. The motion of the substrate support 160 towards the top 122 of the inner chamber 104 may be utilized to, or at least to assist, increasing the pressure within the internal volume 150, for example, when the isolation valves 140 of the fluid circuit 142 are closed.

A plurality of lift pins 174 are disposed in the substrate support 160 to facilitate substrate transfer. The lift pins 174 are disposed in lift pin holes 176 formed through the substrate support 160. The lift pin holes 176 exit the substrate support surface 166 of the substrate support 160 and may also exit the bottom surface 158 of the substrate support 160. Optionally, and in other embodiments, the lift pin holes 176 may be blind holes only open to the substrate support surface 166 of the substrate support 160 while being sealed off from the bottom surface 158 of the substrate support 160. Particularly in embodiments where the volumes 150, 152 that remain isolated at all times such as in the examples depicted in FIGS. 4-7, the holes 176 do not extend through the substrate support 160 to prevent fluid communication between the volumes 150, 152 through the holes 176.

A portion of the lift pin holes 176 reside in a boss 188 projecting from the bottom surface 158 of the substrate support 160. The boss 188, at least when the substrate support 160 is in the lower position shown in FIG. 1, extends through an aperture 180 formed through the bottom 124 of the inner chamber 104.

A magnet 178 is disposed adjacent the aperture 180. A complimentary magnet 190 is disposed at the lower end of the lift pin 174. One of the magnets 178, 190 may, instead of being made of a magnetic material (or an electromagnet), be a material that magnetically is attracted to or repelled by the other of the magnets 178, 190. Thus, as the substrate support 160 is lowered and the boss 188 moves axially adjacent the magnet 178, the magnet 190 causes the lift pins 174 to become stationary relative to the bottom 124 of the inner chamber 104, such that the end of the lift pins 174 proximate the substrate support surface 166 begin to extend from the substrate support surface 166 and space the substrate 168 from the substrate support 160 as the substrate support 160 continues to be lowered by the lift 164. Conversely, as the substrate support 160 is elevated, the lift pins 174 retract back into the substrate support 160, allowing the substrate 168 to become seated on the substrate support surface 166 of the substrate support 160. The lift pins 174 may have a flared head or other geometric to prevent the lift pins 174 from sliding out through the bottom of the lift pin holes 176. Optionally, the lift pin holes 176 may be blind holes which also prevent the lift pins 174 from passing out through the bottom of the lift pin holes 176. In yet another example, the magnets 178, 190 may prevent the lift pins 174 from sliding out through the bottom of the lift pin holes 176.

In operation, the internal volumes 148, 150 of the inner and outer chambers 102, 104 are fluidly connected and maintained in a vacuum condition as the substrate 168 is robotically loaded on the substrate support 160 through the slit valve opening 112 and substrate transfer port 126 from the adjacent chamber 116 while the substrate support 160 is in the lowered position as shown in FIG. 1. The internal volumes 148, 150 are generally filled with an inert gas or simply at vacuum.

Figure 2:
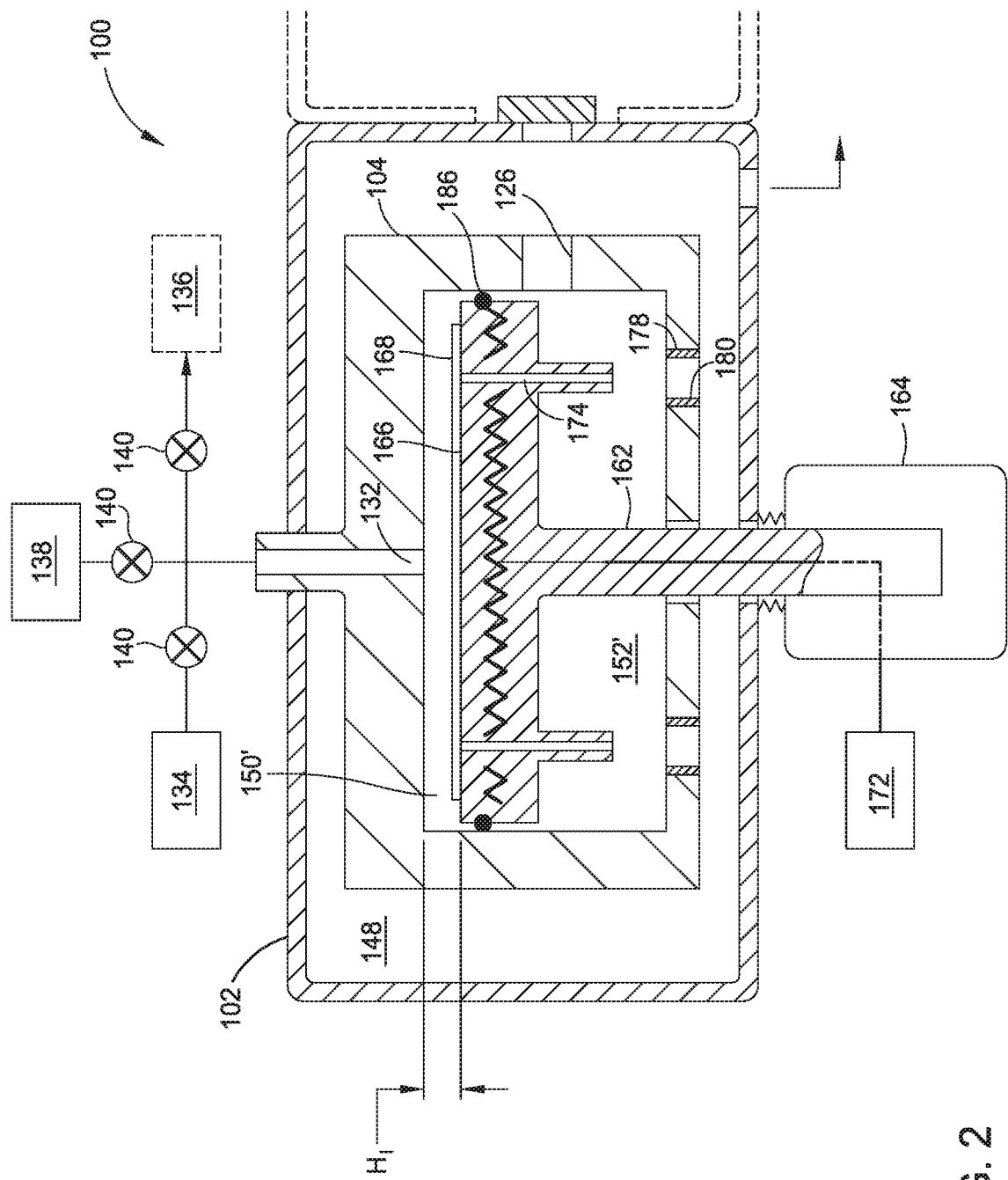
FIG. 2 is a simplified front cross-sectional view of the semiconductor processing system of FIG. 1 having the internal volume of the inner chamber at a second volume.

Once the substrate 168 is disposed on the substrate support 160, the slit valve opening 112 is closed and the substrate support 160 is elevated to an intermediate elevation, such as shown in FIG. 2. At the intermediate elevation, the distance between the substrate support surface 166 and the top 122 of the inner chamber 104 is shown as $H_I$. Since the substrate support 160 at $H_I$ is above the substrate transfer port 126, the seal 186 functions to isolate the internal volume 150 of the inner chamber 104 from the internal volume 148 of the outer chamber 102. At $H_I$, the internal volume 150' above the substrate support 160 is much smaller than the internal volume 150 shown in FIG. 1 while the substrate support 160 is at $H_T$.

While at the intermediate elevation, processing fluids from the source 134 are provided into the internal volume 150'. Since the internal volume 150' is smaller than the internal volume 150, advantageously less processing fluid is need to fill the volume 150'. Moreover, the processing fluid is may be provided to the volume 150' though the port 132 at relatively low pressures (i.e., less than 5 Bar, such as between 0 and 5 Bar, for example at 1 Bar).

Figure 3:
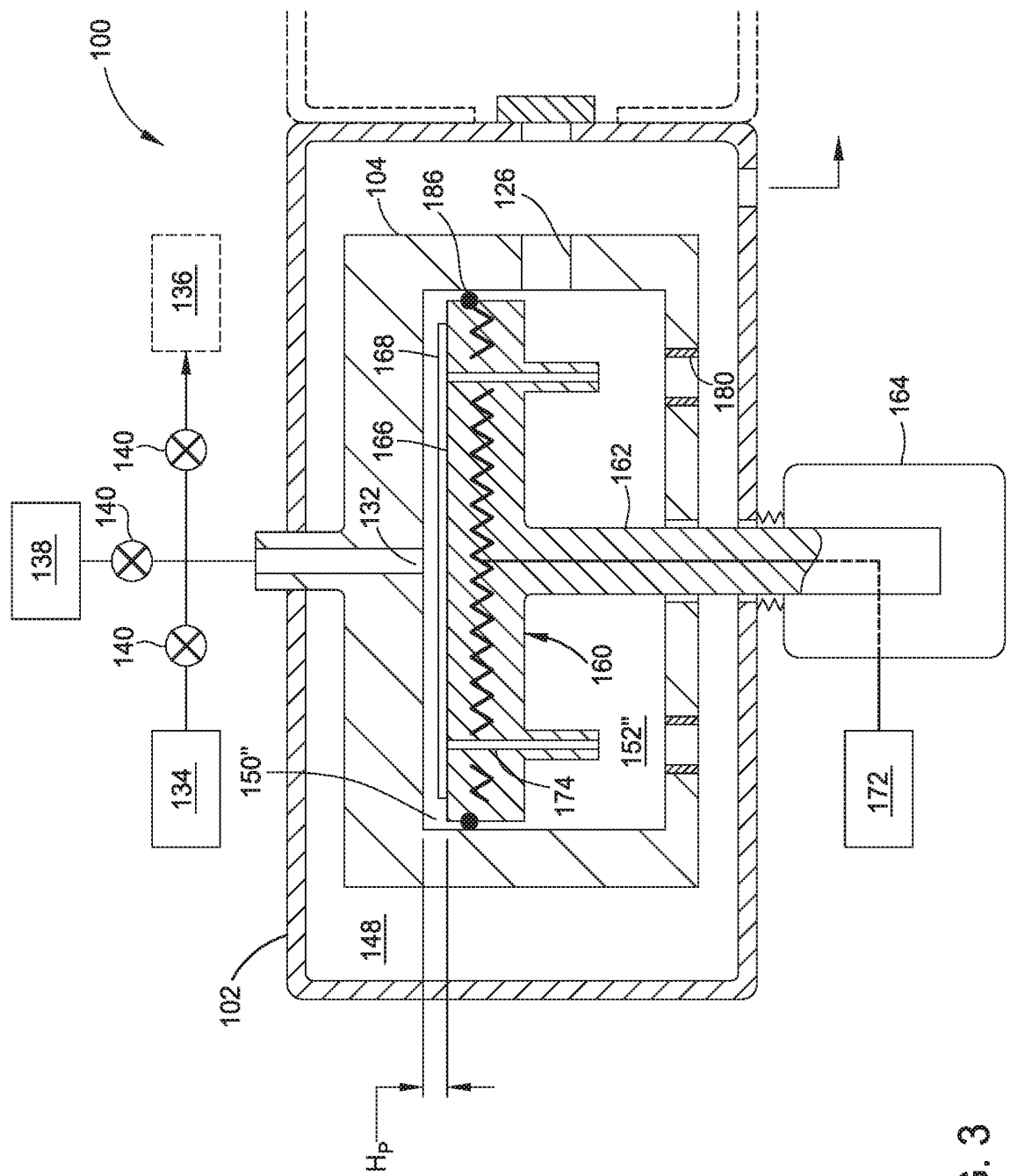
FIG. 3 is a simplified front cross-sectional view of the semiconductor processing system of FIG. 1 having the internal volume of the inner chamber at a third volume.

Once the processing fluid is disposed in the volume 150', the substrate support 160 is further elevated to a processing elevation, such as shown in FIG. 3. At the processing elevation, the distance between the substrate support surface 166 and the top 122 of the inner chamber 104 is shown as $H_P$. $H_P$ is less than $H_I$, and $H_I$ is less than $H_T$. At $H_P$, the internal volume 150" above the substrate support 160 is much smaller than the internal volume 150' shown in FIG. 2. The reduction in volume caused by moving the substrate support 160 from $H_I$ to $H_P$ causes the pressure of the processing fluid within the internal volume 150" to increase to a high pressure (i.e., greater than 5 Bar, such as 50 Bar up to 100 Bar). Thus, the lift 164 has sufficient stroke and force to move the substrate support 160 to generate and hold such high pressures within the internal volume 150" of the inner chamber 104.

The increase in pressure may be accommodated solely by the lift 164 providing sufficient force for moving and holding the substrate support 160 while the seal 186 and isolation valves 140 maintain the internal volume 150" in a static condition. Alternatively, some of the increase in pressure may be provided by delivering a pressure control gas from the fluid handling system 130 to the internal volume 150". The pressure control may be a reactive gas or an inert gas, such as but not limited to nitrogen, argon, and the like, or other suitable gas(es).

At least at the intermediate and processing elevations, the top 122 and portion of the sidewalls 120 exposed to the processing fluid are maintained at a temperature that prevents condensation of the processing fluid within the inner chamber 104. The substrate 168 is also heated by the heater 170. The substrate 168 may be heated by the heater 170 to a temperature above 200 degrees Celsius, such as between 300 and about 450 degrees Celsius, or even up to about 600 degrees Celsius.

While at the processing elevation, the substrate 168 is processed. Processing the substrate 168 may include one or more of depositing a film on the substrate 168, annealing a film on the substrate 168, and densification of a film on the substrate 168, among other processes. Some types of films that may be deposited, annealed, densified or otherwise processed include metal films, oxide films, copper films, and cobalt films, among others. After processing is complete, the isolation valve 140 coupling the exhaust system 136 to the internal volume 150" is opened, allowing the processing fluid to be removed from the inner chamber 104 without condensing within the internal volume 150". Optionally, the exhaust system 136 may be coupled to the inner chamber volume 118 after the substrate support 160 is lowered from the $H_P$ position.

After processing, the substrate support 160 is lowered to the transfer position shown in FIG. 1 to allow the substrate 168 to be removed from the inner chamber 104 and returned to the adjacent chamber 116. Once the substrate 168 is removed, the RPS 138 may provide a cleaning agent to the internal volume 150 to remove residuals and/or process by-products. Before or after cleaning, a purge gas may be provided to the internal volume 150 from the fluid source 135. The purge gas may be an inert gas, such as but not limited to nitrogen, air, argon, and the like.

Figure 4:
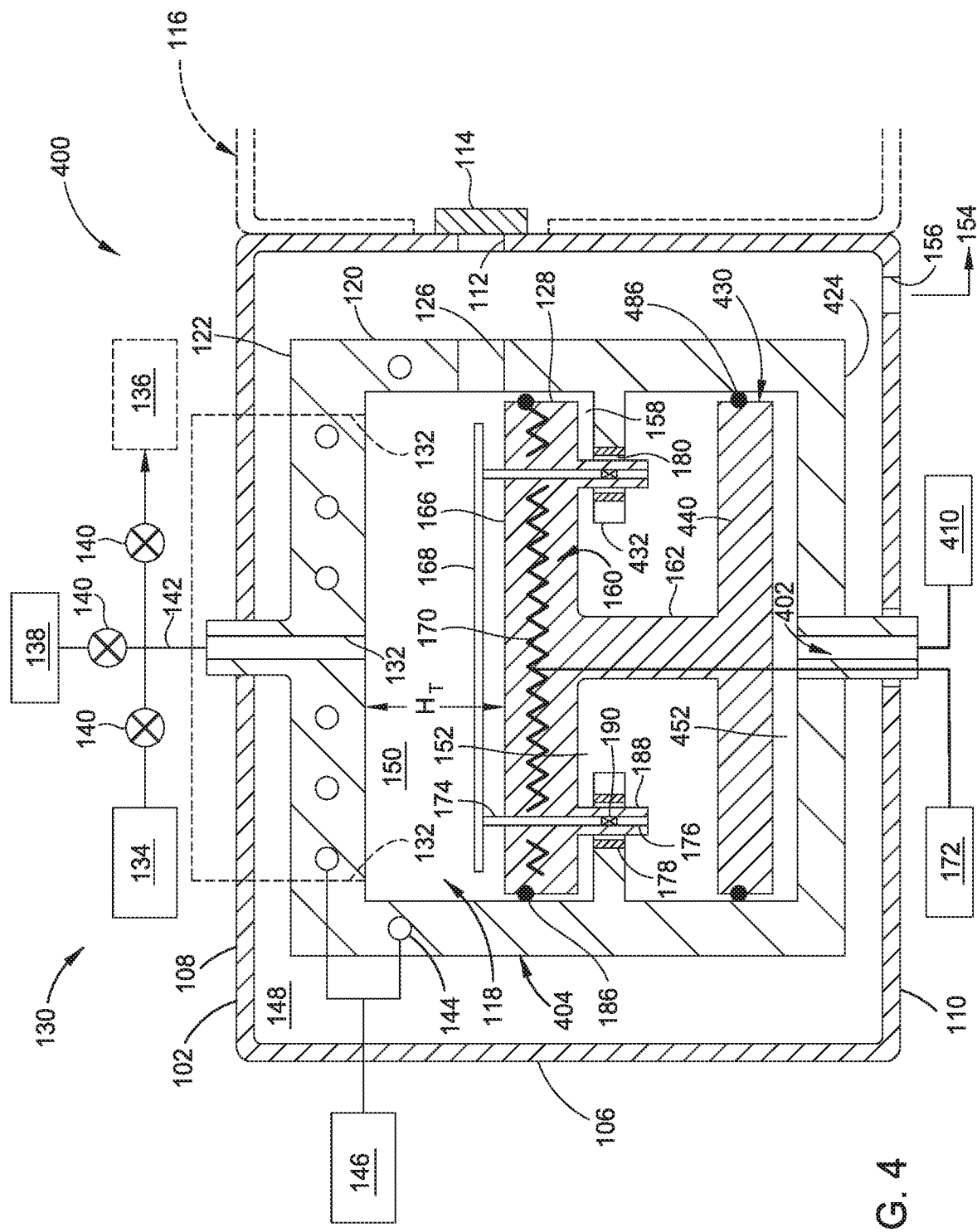
FIG. 4 is a simplified front cross-sectional view of a semiconductor processing system, the semiconductor processing system having an internal volume of an inner chamber at a first volume.

FIG. 4 is a simplified front cross-sectional view of another semiconductor processing system 400. The semiconductor processing system 400 is generally configured and operable essentially the same as the semiconductor processing system 100 described above, except that the lift 164 of the system 100 is replaced by a drive cylinder 430 incorporated into an inner chamber 404.

More specifically, the semiconductor processing system 400 includes an outer chamber 102 that surrounds the inner chamber 404. The semiconductor processing system 400 has a fluid handling system 130 and pumping system 154 that are configured and operate as described above.

The inner chamber 404 may be made from the same materials as the inner chamber 104 described above. The inner chamber 404 includes sidewalls 120, a top 122 and a bottom 424 that encloses an inner chamber volume 118. A substrate support 160 is disposed in the inner chamber volume 118. A substrate access port 126 is formed through the one of the sidewalls 120 of the inner chamber 404 and aligns with the slit valve opening 112 of the outer chamber 102. As with the system 100, the substrate access port 126 does not require sealing, and as shown in FIG. 4, does not have a door for closing the port 126.

The top 108 and at least an upper portion of the sidewalls 120 of the inner chamber 404 include heaters 144 coupled to a heater power source 146. At least one port 132 is disposed through the top 108 and/or sidewalls 120 of the inner chamber 404 for providing processing fluid and/or other fluids into the internal volume 150 of the inner chamber 404 from the fluid handling system 130.

A ledge 432 extends inward from the sidewalls 120 of the inner chamber 404 below the substrate support 160 to retain the magnets 178. In one example, the ledge 432 may be configured as a plurality of tabs. The magnets 178 cooperate with the magnets 190 disposed in the substrate support 160 to function in the same manner as described above with reference to the processing system 100.

The drive cylinder 430 is defined between a piston 440 and the bottom 424 of the inner chamber 404. The piston 440 is coupled to the substrate support 160 by a stem 162. The inner chamber volume 118 is split by the substrate support 160 and piston 440 into three volumes. An internal (processing) volume 150 defined between the substrate support 160 and the top 122 of inner chamber 404. A secondary volume 152 is defined between the substrate support 160 and the piston 440. The flange 432 extends into the secondary volume 152. A working fluid volume 452 defined between the piston 440 and the bottom 124 of inner chamber 404. In this example, the secondary volume 152 remains isolated from both the internal volume 150 and the working fluid volume 452. The secondary volume 152 generally remains at the same pressure as the internal volume 148 of the outer chamber 102. Additionally, the internal volume 150 and the working fluid volume 452 are always isolated from each other. The internal and working fluid volumes 150, 452 are alternatively coupled to the internal volume 148 of the outer chamber 102 depending on the elevation of the substrate support 160.

A seal 186 is disposed between an outer wall 128 of the substrate support 160 and a portion of the sidewalls 120 of the inner chamber 404 that is located between the flange 432 and the top 122 of the inner chamber 404. The seal 186 is configured and functions as described above with reference to the processing system 100. The seal 186 separates the internal volume 150 from the secondary volume 152.

A seal 486 is disposed between the piston 440 and a portion of the sidewalls 120 of the inner chamber 404 that is located between the flange 432 and the bottom 124 of the inner chamber 404. The seal 486 is similar to the seal 186 as described above, although the seal 486 may be fabricated from lower temperature polymers as the seal 486 is spaced from the heaters 144, 170. The seal 486 separates the secondary volume 152 from the working fluid volume 452.

A working fluid source 410 is coupled to the working fluid volume 452 through a port 402 formed in the bottom 424 of the inner chamber 404. The working fluid source 410 includes a pump or other pressure generating device that is operable to drive working fluid into the working fluid volume 452. As working fluid, such as air, nitrogen, or other inert gas, is driven into working fluid volume 452, the pressure differential across the volumes 148, 150, 452 causes the substrate support 160 to move towards the top 122 so as to reduce the volume 150 and consequentially increase the pressure therein.

In operation, the internal volumes 148, 150 of the inner and outer chambers 102, 404 are fluidly connected and maintained in a vacuum condition as the substrate 168 is robotically loaded on the substrate support 160 through the slit valve opening 112 and substrate transfer port 126 from the adjacent chamber 116. The substrate support 160 is in the lowered position as shown in FIG. 4.

Figure 5:
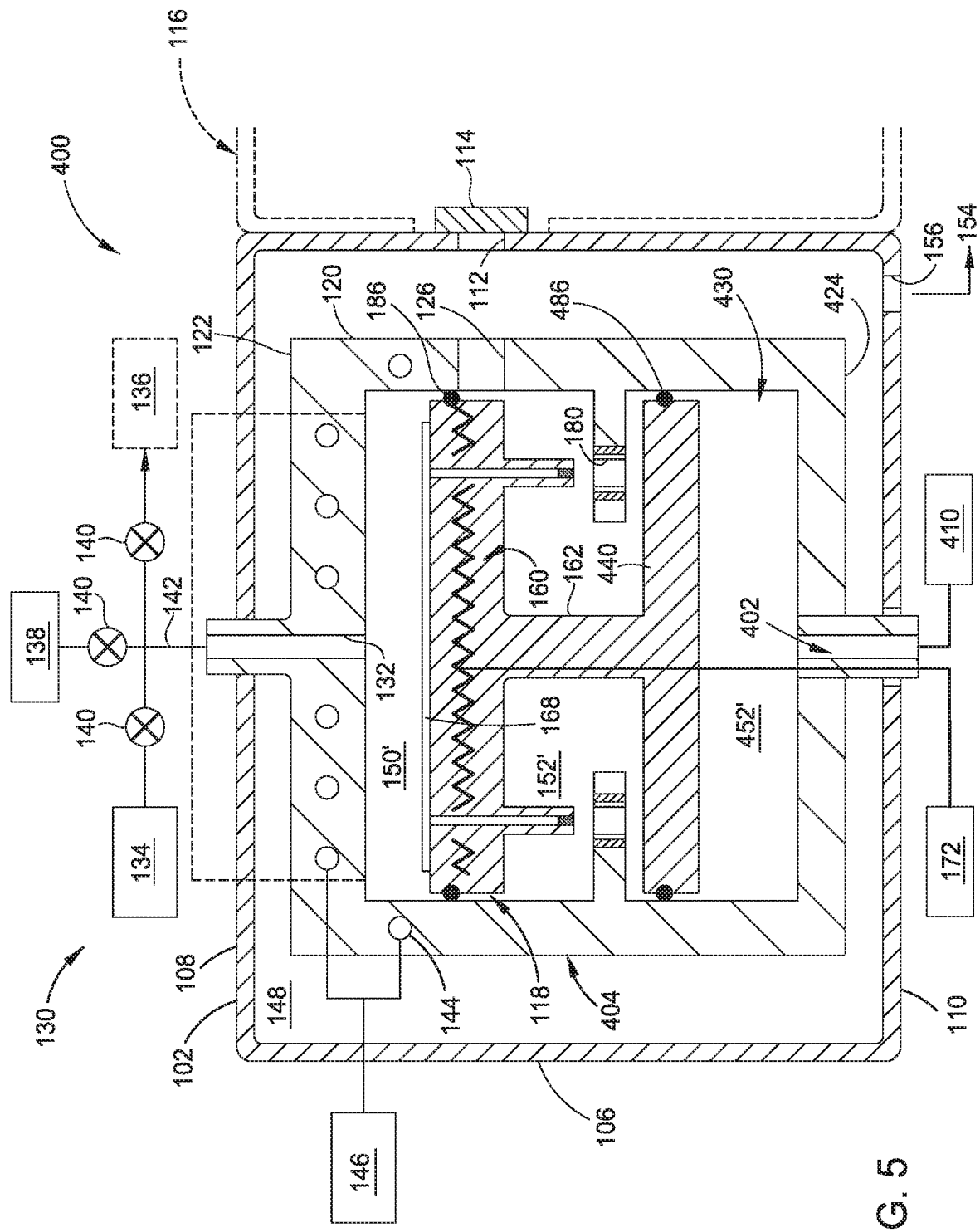
FIG. 5 is a simplified front cross-sectional view of the semiconductor processing system of FIG. 4 having the internal volume of the inner chamber at a second volume.

Once the substrate 168 is disposed on the substrate support 160, the slit valve opening 112 is closed and the substrate support 160 is elevated to an intermediate elevation, such as shown in FIG. 5, by pressurizing the working fluid volume 452 below the piston 440. At the intermediate elevation, the distance between the substrate support 160 and the top 122 of the inner chamber 404 is shown as $H_I$. Since the substrate support 160 at $H_I$ is above the substrate transfer port 126, the seal 186 functions isolates the internal volume 150 of the inner chamber 404 from the internal volume 148 of the outer chamber 102. At $H_I$, the internal volume 150' above the substrate support 160 is much smaller than the internal volume 150 shown in FIG. 1 while the substrate support 160 is at $H_T$.

While at the intermediate elevation, processing fluids from the source 134 are provided into the internal volume 150'. The processing fluid is may be provided to the volume 150' though the port 132 at relatively low pressures (i.e., less than 5 Bar, such as between 0 and 5 Bar, for example at 1 Bar).

Figure 6:
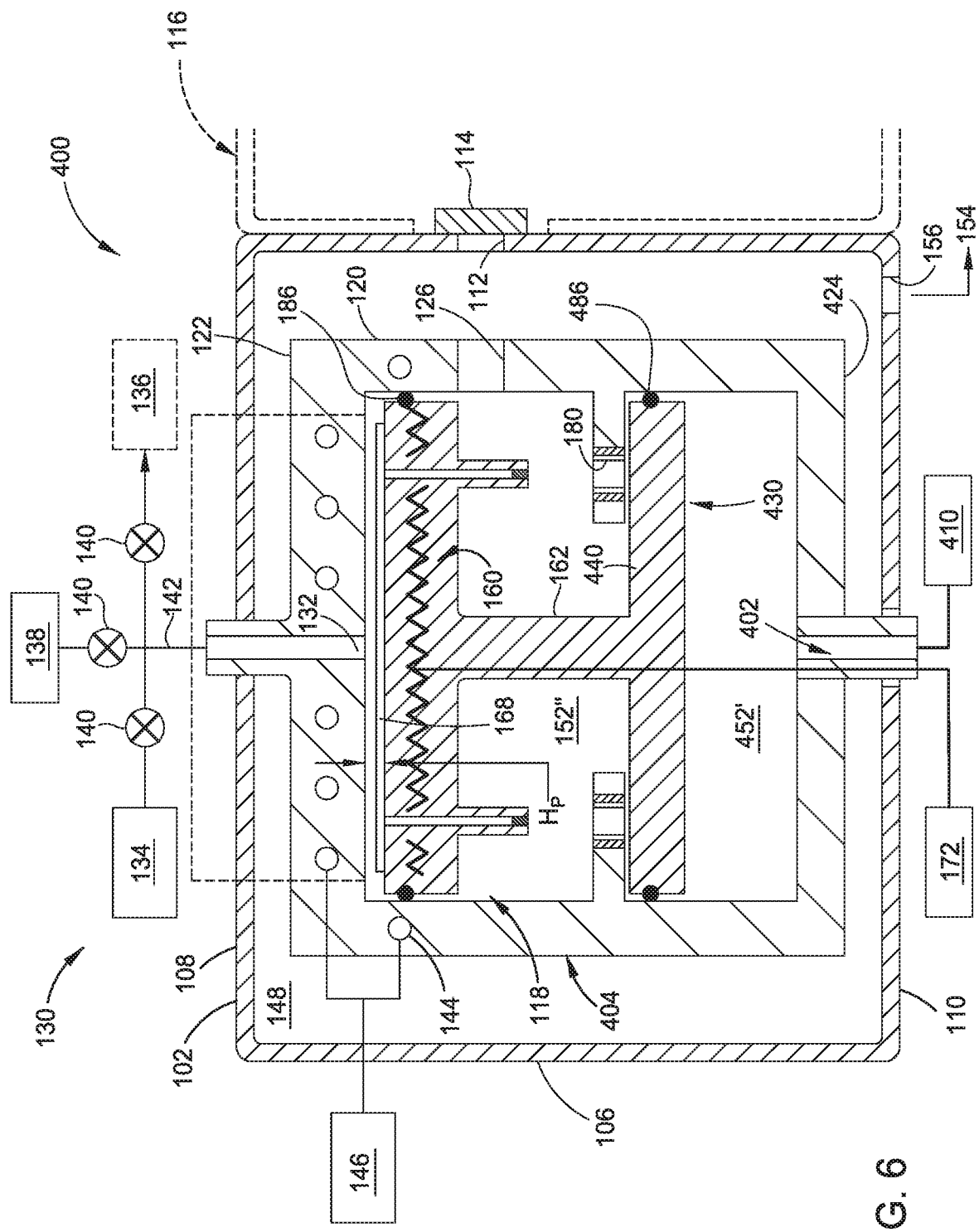
FIG. 6 is a simplified front cross-sectional view of the semiconductor processing system of FIG. 4 having the internal volume of the inner chamber at a third volume.

Once the processing fluid is disposed in the volume 150', the substrate support 160 is further elevated to a processing elevation, such as shown in FIG. 6. by driving additional working fluid into the working fluid volume 452. At the processing elevation, the distance between the substrate support surface 166 and the top 122 of the inner chamber 404 is shown as $H_P$. At $H_P$, the internal volume 150" above the substrate support 160 is much smaller than the internal volume 150' shown in FIG. 2 while the substrate support 160 is at $H_I$. This reduction in volume causes the pressure of the processing fluid within the internal volume 150" to increase to a high pressure (i.e., greater than 5 Bar, such as 50 Bar up to 100 Bar). Thus, the working fluid source 410 can provide sufficient fluid and pressure to to move the substrate support 160 to generate and hold such high pressures within the internal volume 150" of the inner chamber 404.

While in the processing elevation, the substrate 168 is processed as described above. Similarly, after processing, the substrate support 160 is lowered to the transfer position shown in FIG. 4 by removing working fluid from the working fluid volume 452 to allow the substrate 168 to be removed from the inner chamber 404 and transferred into the adjacent chamber 116.

Figure 7:
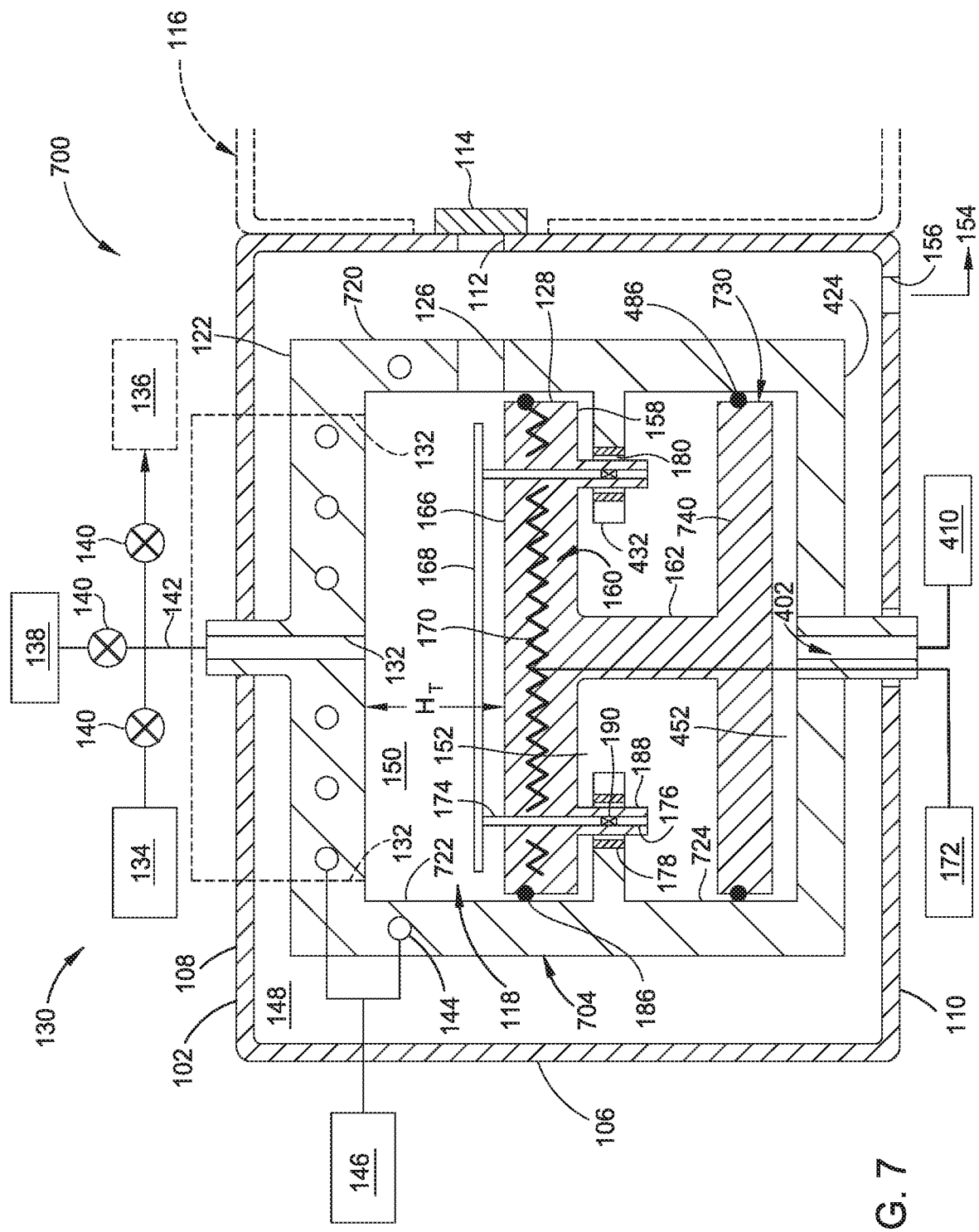
FIG. 7 is a simplified front cross-sectional view of a semiconductor processing system, the semiconductor processing system having an internal volume of an inner chamber at a first volume.

FIG. 7 is a simplified front cross-sectional view of a semiconductor processing system 700. The semiconductor processing system 700 is generally configured and operable essentially the same as the semiconductor processing system 400 described above, except that a diameter of a drive cylinder 630 of the system 700 is larger than a diameter of a substrate support 160 disposed in an inner chamber 704.

More specifically, the inner chamber 704 includes stepped sidewalls 720, a top 122 and a bottom 424 that encloses an inner chamber volume 118. The stepped sidewalls 720 include an upper sidewall 722 terminating at the top 122, and a lower sidewall 724 terminating at the bottom 424. A substrate support 160 is disposed in the inner chamber volume 118 and is circumscribed by the upper sidewall 722. A substrate access port 126 is formed through the upper sidewall 722 of the inner chamber 404 and aligns with the slit valve opening 112 of the outer chamber 102. As with the system 400, the substrate access port 126 does not require sealing and as shown in FIG. 4, does not have a door for closing the port 126. The inner chamber 704 may be made from the same materials as the inner chamber 104 described above.

The top 108 and the upper sidewall 722 of the inner chamber 404 include heaters 144 coupled to a heater power source 146. At least one port 132 is disposed through the top 108 and/or upper sidewall 722 of the inner chamber 404 for providing processing fluid and/or other fluids into the internal volume 150 of the inner chamber 404 from the fluid handling system 130.

A ledge (or tabs) 432 extends inward from the sidewalls 120 of the inner chamber 404 below the substrate support 160 to retain the magnets 178. The ledge 432 may be coupled to either of the upper or lower sidewalls 722, 724. The magnets 178 cooperate with the magnets 190 disposed in the substrate support 160 to function in the same manner as described above with reference to the processing system 100.

The drive cylinder 730 is defined between a piston 740, the lower sidewall 724, and the bottom 442 of the inner chamber 404. The piston 740 is coupled to the substrate support 160 by a stem 162. The piston 740 has a diameter greater than a diameter of the substrate support 160.

Similar to the system 400, the inner chamber volume 118 is split by the substrate support 160 and the piston 740 into an internal (processing) volume 150, a secondary volume 152, and a working fluid volume 452. Since the diameter of the working fluid volume 452 (defined by the piston diameter) is greater than a diameter of the internal volume 150 (defined by the substrate support diameter), the pressure generated by the working fluid providing to the working fluid volume 452 will advantageously generate a larger pressure in the internal volume 150. Other than this difference, the systems 400, 700 operate in the same manner.

The systems 100, 400, 700 described above allow substrates to be advantageously processed at low temperatures and at high pressures. Controlling processing pressure at least in part by reducing the volume of the processing volume beneficially allows less processing fluids to be utilized, while the simplifying fluid delivery system. The simplified fluid delivery system, which does not require extensive high pressure hardware and controls, is less costly and enables use of a wider variety of fluids.

While the foregoing is directed to particular embodiments of the present disclosure, it is to be understood that these embodiments are merely illustrative of the principles and applications of the present invention. It is therefore to be understood that numerous modifications may be made to the illustrative embodiments to arrive at other embodiments without departing from the spirit and scope of the present inventions, as defined by the appended claims.

What is claimed is:

1. A substrate processing system comprising:
   an inner chamber having a substrate access port and an inner chamber internal volume;
   an outer chamber surrounding the inner chamber, the outer chamber having an outer chamber internal volume, a slit valve door and a slit valve opening aligned with the substrate access port configured to allow egress of a substrate utilizing a single motion of a robot blade extending through the slit valve opening into the substrate access port, the outer chamber configured to operate at a pressure between about 1 mTorr to about 600 Torr, the inner chamber internal volume configured that, when isolated from the outer chamber internal volume, is changeable such that the pressure within the inner chamber internal volume may be varied while the outer chamber is maintained under vacuum;
   a substrate support disposed in the inner chamber internal volume upon which the substrate is positioned during processing; and wherein
   the inner chamber internal volume having an upper volume defined above the substrate support and a lower volume defined below the substrate support, wherein the upper volume and lower volume are fluidly isolated when the substrate is in a raised processing position and in a lowered transfer position, and wherein substrate access port is adjacent with the upper volume when the substrate support is in the lowered transfer position and adjacent with the lower volume when the substrate support is in the raised processing position.

2. The substrate processing system of claim 1 wherein the upper volume is fluidly connected to the outer chamber through the substrate access port when the substrate support is in the lowered transfer position, and the lower volume is fluidly connected to the outer chamber through the substrate access port when the substrate support is in the raised process position.

3. The substrate processing system of claim 2 further comprising:
a pneumatic or hydraulic external cylinder outside of the inner chamber internal volume, the pneumatic or hydraulic cylinder coupled to the substrate support and configured to move the substrate support between the raised process position reducing the upper volume and the lowered transfer position increasing the upper volume.

4. The substrate processing system of claim 3 wherein a force provided by the external cylinder results in between about 5 bar and about 100 bar acting on the substrate support.

5. The substrate processing system of claim 2 further comprising:
a lift disposed in the inner volume, the lift coupled to the substrate support and configured to move the substrate support between the raised process position and the lowered transfer position.

6. The substrate processing system of claim 5 wherein the lift is one of a hydraulic or pneumatic actuator, a linear actuator, a lead screw, or other actuator suitable of generating a large force sufficient to maintain the position of the substrate support in a high pressure environment.

7. The substrate processing system of claim 5 wherein the lift has sufficient stroke and force to move the substrate support to generate and hold high pressures within the upper volume exceeding about 5 bar.

8. A substrate processing system comprising:
an outer chamber having an internal volume, a slit valve door, and a slit valve opening, the outer chamber configured to operate at a pressure of between about 1 mTorr to about 600 Torr;
an inner chamber disposed within the internal volume of the outer chamber, the inner chamber having sidewalls an inner volume, and a substrate access port aligned with the slit valve door configured to allow egress of the substrate utilizing a single motion of a robot blade extending through the slit valve opening into the substrate access port, the inner volume is changeable such that the pressure within the inner volume may be varied while the outer chamber is maintained under vacuum;
a substrate support having an outer wall, the substrate support disposed in the inner volume and moveable between an top position and a bottom position; wherein the inner chamber internal volume having an upper volume defined above the substrate support and a lower volume defined below the substrate support, wherein the upper volume and lower volume are fluidly isolated when the substrate is in the top position and in the bottom position, and wherein substrate access port is adjacent with the upper volume when the substrate support is in the bottom position and adjacent with the lower volume when the substrate support is in the top position; and
a seal disposed between the outer wall and the sidewall wherein the pressure differential across the seal is greater than 1 Bar when the substrate support is in the top position.

9. The substrate processing system of claim 8 wherein the upper volume is fluidly connected to the outer chamber through the substrate access port when the substrate support is in the bottom position, and the lower volume is fluidly connected to the outer chamber through the substrate access port when the substrate support is in the top position.

10. The substrate processing system of claim 9 further comprising:
a pneumatic or hydraulic external cylinder outside of the inner volume, the pneumatic or hydraulic cylinder coupled to the substrate support and configured to move the substrate support between the top position reducing the upper volume and the bottom position increasing the upper volume.

11. The substrate processing system of claim 10 wherein a force provided by the external cylinder that results in between about 5 bar and about 100 bar acting on the substrate support.

12. The substrate processing system of claim 9 further comprising:
a lift disposed in the inner volume, the lift coupled to the substrate support and configured to move the substrate support between the top position and the bottom position.

13. The substrate processing system of claim 12 wherein the lift is one of a hydraulic or pneumatic actuator, a linear actuator, a lead screw, or other actuator suitable of generating a large force sufficient to maintain the position of the substrate support in a high pressure environment.

14. The substrate processing system of claim 12 wherein the lift has sufficient stroke and force to move the substrate support to generate and hold high pressures within the upper volume.

15. The substrate processing system of claim 14 wherein high pressures within the upper volume results from 100 bar acting on the substrate support.

* * * * *